(12) United States Patent
Jeon et al.

(10) Patent No.: US 12,182,367 B2
(45) Date of Patent: Dec. 31, 2024

(54) TOUCH SENSING DEVICE AND DISPLAY DEVICE INCLUDING THE SAME

(71) Applicant: Samsung Display Co., Ltd., Yongin-si (KR)

(72) Inventors: Byeong Kyu Jeon, Busan (KR); Jeong Heon Lee, Hwaseong-si (KR); Chang Bum Kim, Pyeongtaek-si (KR); Jung Mok Park, Hwaseong-si (KR); Hee Woong Park, Hwaseong-si (KR); Sang Wook Yoo, Hwaseong-si (KR); Young Seok Yoo, Suwon-si (KR); Choon Hyop Lee, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 296 days.

(21) Appl. No.: 16/708,410

(22) Filed: Dec. 9, 2019

(65) Prior Publication Data

US 2020/0301541 A1    Sep. 24, 2020

(30) Foreign Application Priority Data

Mar. 22, 2019   (KR) ........................ 10-2019-0032887

(51) Int. Cl.
*G06F 3/044*    (2006.01)
*G06F 3/041*    (2006.01)
(Continued)

(52) U.S. Cl.
CPC .......... *G06F 3/0443* (2019.05); *G06F 3/0412* (2013.01); *H05K 1/0281* (2013.01); *H05K 1/147* (2013.01); *G06F 2203/04112* (2013.01)

(58) Field of Classification Search
None
See application file for complete search history.

(56) References Cited

U.S. PATENT DOCUMENTS 9,122,362 B2    9/2015  Park et al.
9,189,027 B2    11/2015 Lee et al.
(Continued)

FOREIGN PATENT DOCUMENTS

CN    106887186    6/2017
CN    107004697    8/2017
(Continued)

OTHER PUBLICATIONS

Office Action dated Feb. 2, 2024 for Korean Patent Application No. 10-2019-0032887.

*Primary Examiner* — Benjamin X Casarez
(74) *Attorney, Agent, or Firm* — Lewis Roca Rothgerber Christie LLP

(57) ABSTRACT

A touch sensing device includes a base layer, a touch electrode layer, a first reinforcing member, and a touch circuit board. The base layer includes a main area and a protruding area protruding from the main area in a first direction. The touch electrode layer is disposed on a surface of the base layer. The first reinforcing member is disposed on a surface of the protruding area. The touch circuit board is electrically connected to the touch electrode layer. The protruding area includes a bending area and a pad area. The bending area is bent downward. The pad area extends from the bending area in the first direction and overlaps the base layer in a second direction intersecting the first direction in a bent state of the bending area. The touch circuit board is attached to the pad area.

19 Claims, 23 Drawing Sheets

(51) Int. Cl.
  *H05K 1/02* (2006.01)
  *H05K 1/14* (2006.01)

(56) References Cited

U.S. PATENT DOCUMENTS

| | | | |
|---|---|---|---|
| 9,535,522 B2 | 1/2017 | Ahn | |
| 9,780,157 B2 | 10/2017 | Kwon et al. | |
| 9,818,974 B2 | 11/2017 | Kwon et al. | |
| 10,038,013 B2 | 7/2018 | Kwon et al. | |
| 10,490,770 B2 | 11/2019 | Kim et al. | |
| 10,720,474 B2 | 7/2020 | Hwang et al. | |
| 11,024,828 B2 | 6/2021 | Kim et al. | |
| 11,048,370 B2 | 6/2021 | Ko et al. | |
| 11,064,198 B2 | 7/2021 | Park et al. | |
| 11,114,426 B2 | 9/2021 | Wang | |
| 11,183,651 B2 | 11/2021 | Jung et al. | |
| 11,201,195 B2 | 12/2021 | Hong et al. | |
| 2012/0147467 A1 | 6/2012 | Park | |
| 2012/0307423 A1* | 12/2012 | Bohn | H04M 1/0216 361/679.01 |
| 2015/0049428 A1* | 2/2015 | Lee | G06F 1/1641 361/679.27 |
| 2017/0179423 A1* | 6/2017 | Kwon | H01L 27/3276 |
| 2017/0352834 A1* | 12/2017 | Kim | H01L 51/0097 |
| 2018/0076412 A1* | 3/2018 | Kim | H04M 1/0266 |
| 2018/0098442 A1* | 4/2018 | Han | G06F 1/1637 |
| 2018/0145124 A1 | 5/2018 | Kim et al. | |
| 2018/0166507 A1* | 6/2018 | Hwang | G06F 3/041 |
| 2018/0356859 A1* | 12/2018 | Hamburgen | G06F 1/1626 |
| 2018/0375043 A1* | 12/2018 | Jung | H01L 27/3262 |
| 2019/0019855 A1* | 1/2019 | Park | H01L 51/5246 |
| 2019/0107866 A1* | 4/2019 | Han | G06F 1/1637 |
| 2019/0318689 A1* | 10/2019 | Kim | H01L 51/5237 |
| 2019/0355761 A1* | 11/2019 | Chang | H01L 51/0097 |
| 2020/0136066 A1* | 4/2020 | Jin | H10K 59/40 |
| 2020/0396837 A1* | 12/2020 | Tian | H10K 59/12 |
| 2021/0096668 A1* | 4/2021 | Kwon | G06F 3/04164 |
| 2021/0132724 A1* | 5/2021 | Kwon | H01L 51/0097 |
| 2021/0183840 A1* | 6/2021 | Wang | H10K 71/00 |
| 2021/0226147 A1* | 7/2021 | Zhu | H10K 50/80 |

FOREIGN PATENT DOCUMENTS

| | | |
|---|---|---|
| CN | 107464887 | 12/2017 |
| CN | 107809873 | 3/2018 |
| CN | 107885383 | 4/2018 |
| CN | 107978626 | 5/2018 |
| CN | 108052233 | 5/2018 |
| CN | 109118963 | 1/2019 |
| CN | 109375399 | 2/2019 |
| CN | 109377883 | 2/2019 |
| CN | 109388278 | 2/2019 |
| CN | 109461382 | 3/2019 |
| KR | 10-2012-0065686 | 6/2012 |
| KR | 10-2013-0087746 | 8/2013 |
| KR | 10-2015-0021167 | 3/2015 |
| KR | 20160082189 | 7/2016 |
| KR | 10-2016-0111839 | 9/2016 |
| KR | 10-2017-0071986 | 6/2017 |
| KR | 10-2018-0066667 | 6/2018 |
| KR | 10-2018-0078423 | 7/2018 |
| KR | 10-2019-0000967 | 1/2019 |

* cited by examiner

RFM1_3: RFM1a, RFM1b, RFM1c, RFM1d, RFM1e
RFM2_3: RFM2a, RFM2b, RFM2c, RFM2d
RFM_6: RFM1_3, RFM2_3

RFM1_4: RFM1a, RFM1b, RFM1c, RFM1d, RFM1e
RFM2_4: RFM2a, RFM2b, RFM2c, RFM2d
RFM_7: RFM1_4, RFM2_4

TOUCH SENSING DEVICE AND DISPLAY DEVICE INCLUDING THE SAME

CROSS-REFERENCE TO RELATED APPLICATION

This application claims priority to and the benefit of Korean Patent Application No. 10-2019-0032887, filed Mar. 22, 2019, which is hereby incorporated by reference for all purposes as if fully set forth herein.

BACKGROUND

Field

Exemplary embodiments generally relate to a touch sensing device and a display device including the same.

Discussion

Electronic devices that provide images to a user, such as smartphones, tablet personal computers (PCs), digital cameras, notebook computers, navigation systems, smart televisions, and the like, include display devices for displaying images. A display device may include a display panel that generates and displays an image and various input devices. To reduce a light shielding area of a display device, a non-display area in which a display driving circuit, etc., of a display panel may be bent and disposed toward a lower surface of a display area. However, since a pad portion and a touch circuit board disposed on a side of a touch sensing device located on the display panel can be seen, it is difficult to reduce the light shielding area of the display device.

The above information disclosed in this section is only for understanding the background of the inventive concepts, and, therefore, may contain information that does not form prior art.

SUMMARY

Some exemplary embodiments are capable of providing a securely bendable touch sensing device and a display device including the same.

Additional aspects will be set forth in the detailed description which follows, and, in part, will be apparent from the disclosure, or may be learned by practice of the inventive concepts.

According to some exemplary embodiments, a touch sensing device includes a base layer, a touch electrode layer, a first reinforcing member, and a touch circuit board. The base layer includes a main area and a protruding area protruding from the main area in a first direction. The touch electrode layer is disposed on a surface of the base layer. The first reinforcing member is disposed on a surface of the protruding area. The touch circuit board is electrically connected to the touch electrode layer. The protruding area includes a bending area and a pad area. The bending area is bent downward. The pad area extends from the bending area in the first direction and overlaps the base layer in a second direction intersecting the first direction in a bent state of the bending area. The touch circuit board is attached to the pad area.

According to some exemplary embodiments, a display device includes a display panel and a touch sensing device. The display panel includes a first main area and a first protruding area protruding from the first main area in a first direction. The touch sensing device is disposed on the display panel. The touch sensing device includes a second main area overlapping the first main area and a second protruding area overlapping the first protruding area. The first protruding area includes a first bending area and a first pad area. The first bending area is bent downward from the display panel. The first pad area extends from the first bending area in the first direction and overlaps the display panel in a second direction intersecting the first direction in a bent state of the first bending area. The second protruding area includes a second bending area and a second pad area. The second bending area is bent outside the first protruding area. The second pad area extends from the second bending area in the first direction and overlaps the display panel in the second direction in a bent state of the second bending area. A first reinforcing member is disposed on a surface of the second protruding area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF THE ILLUSTRATED EMBODIMENTS

Figure 1:
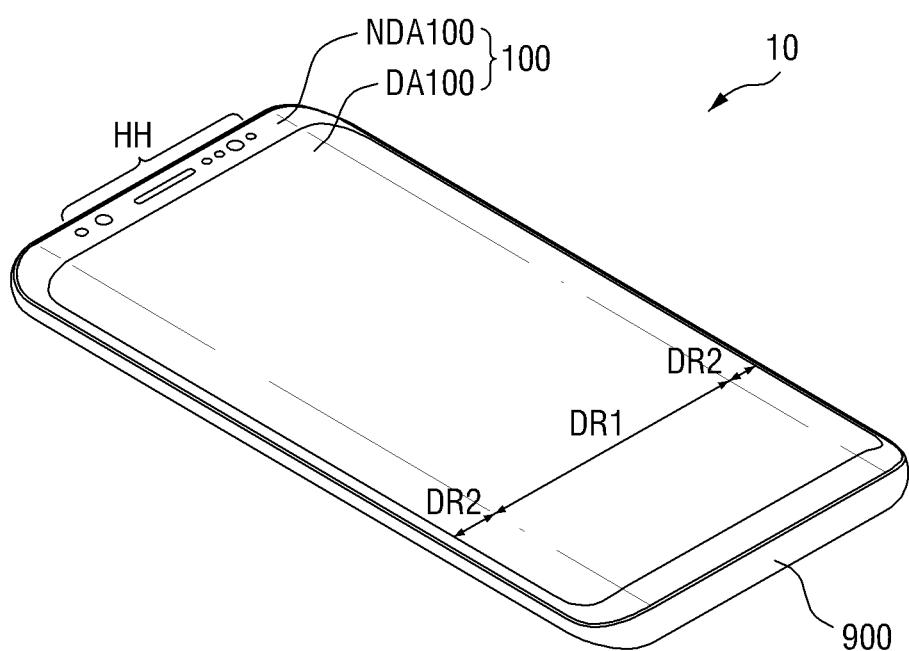
FIG. 1 is a perspective view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
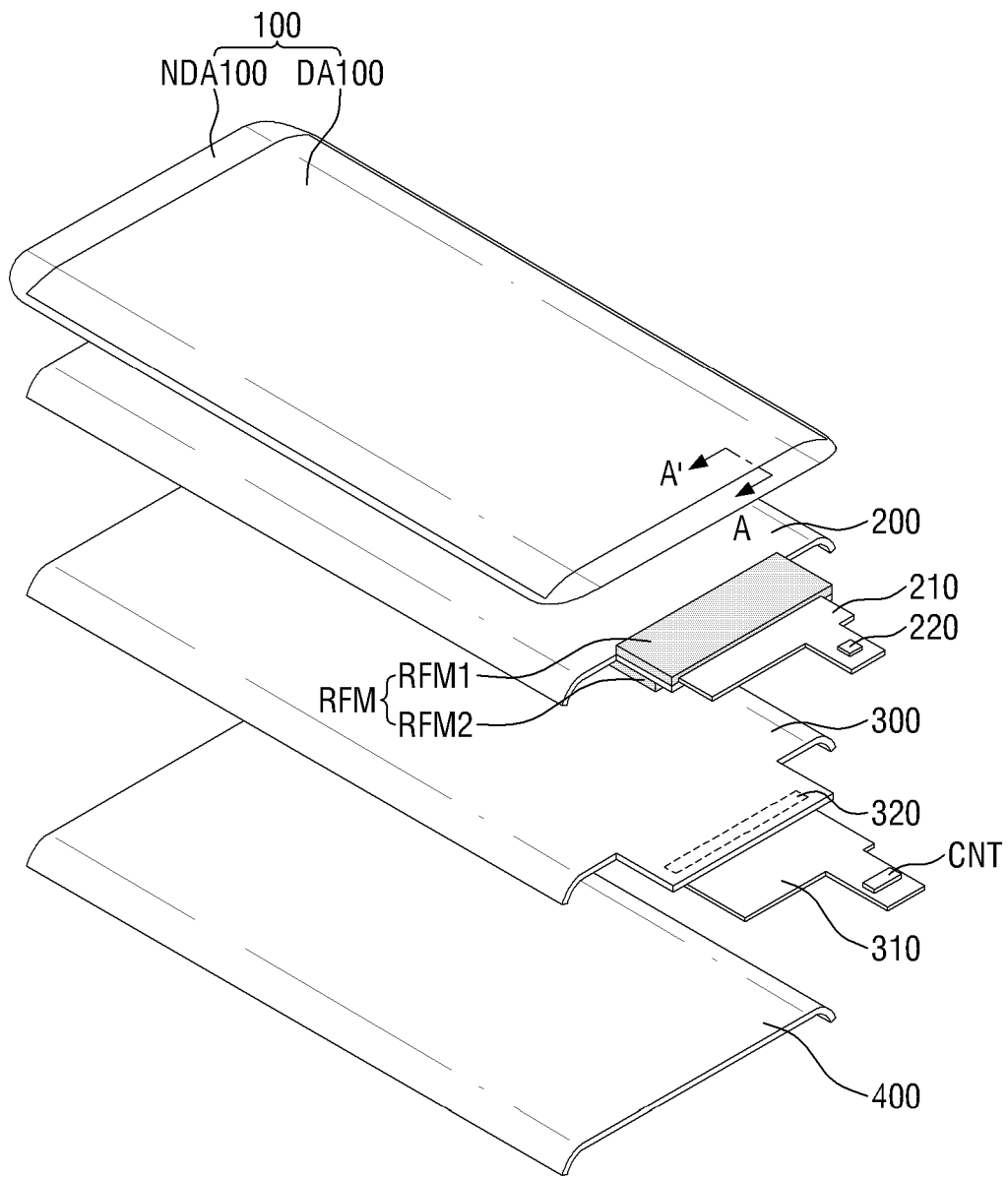
FIG. 2 is an exploded perspective view schematically illustrating a cover window, a touch sensing device, a display panel, and an under-panel member of the display device of FIG. 1 according to some exemplary embodiments.

FIG. 1 is a perspective view of a display device according to some exemplary embodiments. FIG. 2 is an exploded perspective view schematically illustrating a cover window, a touch sensing device, a display panel, and an under-panel member of the display device of FIG. 1 according to some exemplary embodiments.

Referring to FIGS. 1 and 2, the display device 10 according to some exemplary embodiments includes a cover window 100, a touch sensing device 200, a touch circuit board 210, a touch driver 220, a display panel 300, a display circuit board 310, a display driver 320, an is under-panel member 400, and a lower cover 900, which houses the aforementioned elements and is coupled to the cover window 100.

For descriptive purposes, the terms "above," "top," and "upper surface" will be used to indicate a direction in which the cover window 100 is disposed with respect to the display panel 300, e.g., a Z-axis direction, and the terms "below," "bottom,"'and "lower surface" will be used to indicate a direction in which the under-panel member 400 is disposed with respect to the display panel 300, e.g., a direction opposite to the Z-axis direction. In addition, the terms "left," "right," "upper," and "lower" will be used to indicate directions when the display panel 300 is seen in a plan view. For example, "left" will be used to indicate a direction opposite to an X-axis direction, "right" will be used to indicate the X-axis direction, "upper" will be used to indicate the Z-axis direction and/or a Y-axis direction, and "lower" will be used to indicate the direction opposite to the Z-axis direction or a direction opposite to the Y-axis direction.

The display device 10 may be rectangular in a plan view. For example, the display device 10 may have a rectangular planar shape having short sides in a first direction (e.g., X-axis direction) and long sides in a second direction (e.g., Y-axis direction) as illustrated in FIGS. 1 and 2. Each corner where a short side extending in the first direction (e.g., X-axis direction) meets a long side extending in the second direction (e.g., Y-axis direction) r ray be rounded with a predetermined curvature or may be right-angled. It, however, is contemplated that the planar shape of the display device 10 is not limited to the rectangular shape, but may be another polygonal shape, a circular shape, an elliptical shape, etc.

The display device 10 may include a first area DR1 formed flat and a second area DR2 extending from each of right and left sides of the first area DR1. The second area DR2 may be formed flat or curved. When the second area DR2 is formed flat, an angle formed by the first area DR1 and the second area DR2 may be an obtuse angle. When the second area DR2 is formed curved, it may have a constant curvature or a varying curvature.

In FIG. 1, the second area DR2 extends from each of the right and left sides of the first area DR1. However, exemplary embodiments are not limited to this case. For instance, the second area DR2 may extend from only one of the right and left sides of the first area DR1. As another example, the second area DR2 may extend not only from the right and left sides of the first area DR1, but also from at least one of upper and lower sides of the first area DR1. A case where the second area DR2 is disposed at right and left edges of the display device 10 will be mainly described below.

Figure 8:
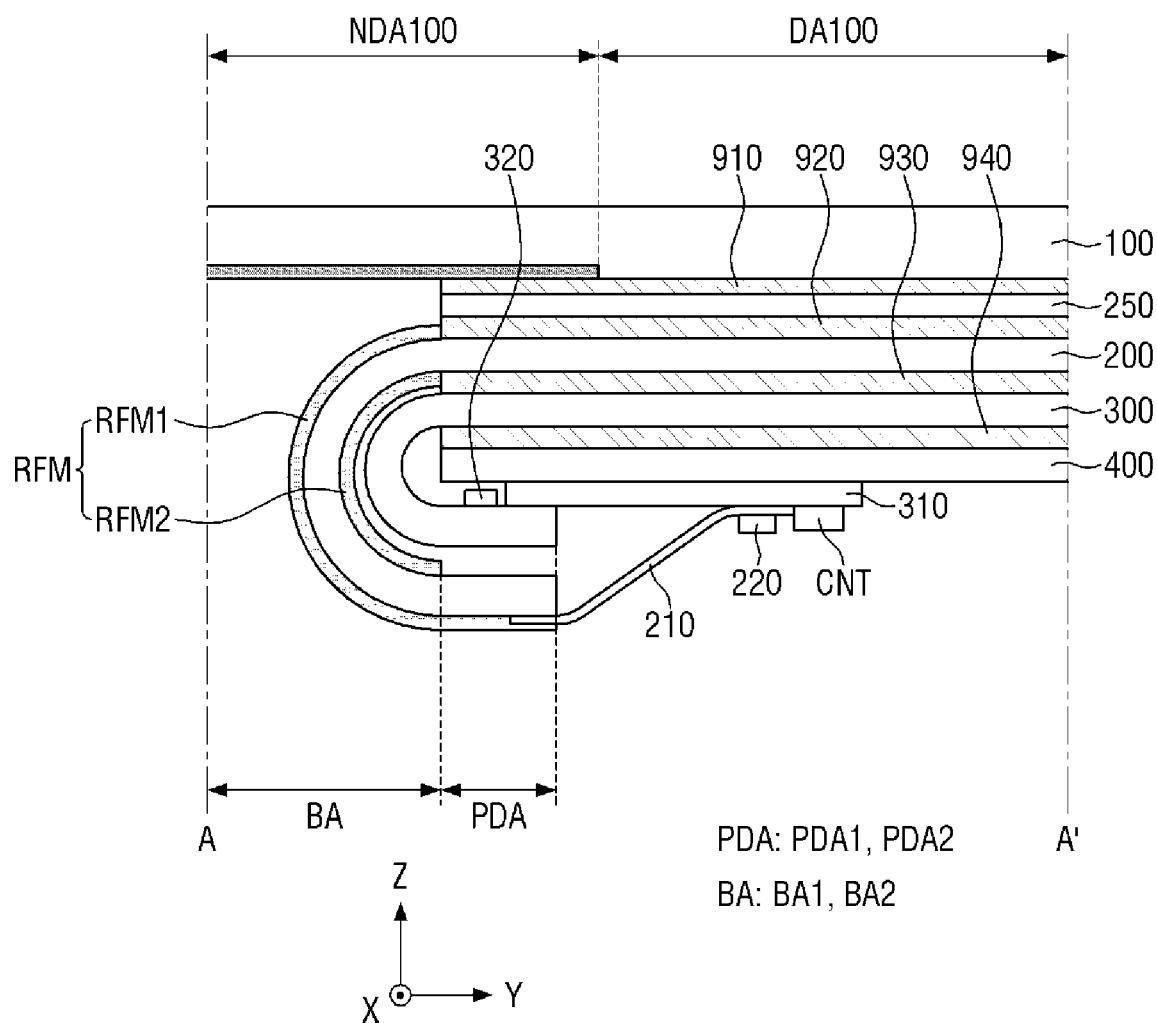
FIG. 8 is a cross-sectional view of the display device of FIG. 2 taken along sectional line A-A' according to some exemplary embodiments.

The cover window 100 may be disposed above the display panel 300 to cover an upper surface of the display panel 300. As such, the cover window 100 may function to protect the upper surface of the display panel 300. The cover window 100 may be attached to a polarizing member 250 by a first adhesive member 910 as illustrated in FIG. 8. The first adhesive member 910 may be an optically clear adhesive film (OCA) or an optically clear resin (OCR), but exemplary embodiments are not limited thereto.

The cover window 100 may include a light transmitting portion DA100 corresponding to the display panel 300 and a light shielding portion NDA100 corresponding to an area other than the display panel 300. The cover window 100 may be disposed in the first area DR1 and the second areas DR2. The light transmitting portion DA100 may be disposed in a part of the first area DR1 and a part of each of the second areas DR2. The light shielding portion NDA100 may be formed opaque. It is also contemplated that the light shielding portion NDA100 may be formed as a decorative layer having a pattern that can be shown to a user when an image is not displayed. For example, the light shielding portion NDA100 may be patterned with a company's logo, such as "SAMSUNG" or various characters and/or images. In addition, in some exemplary embodiments, holes HH for exposing, for instance, at least one of a front camera, a front speaker, an infrared sensor, an iris recognition sensor, an illuminance sensor, etc., may be formed in the light shielding portion NDA100. In some exemplary embodiments, some or all of the front camera, the front speaker, the infrared sensor, the iris recognition sensor, and the illuminance sensor may be embedded in the display panel 300.

The cover window 100 may be made of any suitable material, such as, for instance, glass, sapphire, and/or plastic. The cover window 100 may be rigid and/or flexible.

The touch sensing device 200 may be disposed between the cover window 100 and the display panel 300. The touch sensing device 200 may be disposed in the first area DR1 and the second areas DR2. Accordingly, a user's touch (or touch interaction) can be sensed not only in the first area DR1, but also in the second areas DR2.

In some exemplary embodiments, the polarizing film 250 may be disposed between the touch sensing device 200 and the cover window 100 as illustrated in FIG. 8 to prevent or at least reduce (hereinafter, referred to as "prevent") a decrease in visibility due to reflection of external light. The touch sensing device 200 may be attached to a lower surface of the polarizing member 250 by a second adhesive member 920. The second adhesive member 920 may be an OCA or an OCR, but exemplary embodiments are not limited thereto. The polarizing member 250 may include, for example, at least one of a linear polarizer, a retardation layer having a $\lambda/4$ retardation value, and a retardation layer having a $\lambda/2$ retardation value. In some exemplary embodiments, the polarizing member 250 between the touch sensing device 200 and the cover window 100 may be omitted. In this case, the touch sensing device 200 may be directly attached to the cover window 100.

According to some exemplary embodiments, the touch sensing device 200 is a device for sensing a user's touch (or touch interaction) position, and may be implemented as a capacitance type, such as a self-capacitance type and/or a mutual capacitance type. The touch sensing device 200 may include only touch driving electrodes when implemented as the self-capacitance type and may include touch driving electrodes and touch sensing electrodes when implemented as the mutual capacitance type. A case where the touch sensing device 200 is implemented as the mutual capacitance type will be mainly described below.

The touch sensing device 200 may be formed in the form of a panel or a film. In this case, the touch sensing device 200 may be attached onto a thin-film encapsulation layer of the display panel 300 by a third adhesive 930 as illustrated in FIG. 8. The third adhesive member 930 may be an OCA or an OCR, but exemplary embodiments are not limited thereto.

The touch circuit board 210 may be attached to a side of the touch sensing device 200. For instance, an end of the touch circuit board 210 may be attached onto pads provided on a side of the touch sensing device 200 using, for instance, an anisotropic conductive film. In addition, a touch connection portion may be provided at the other end of the touch circuit board 210. The touch connection portion may be connected to a connector CNT of the display circuit board 310 as illustrated in FIG. 8. The touch circuit board 210 may be, for instance, a flexible printed circuit board.

Figure 4:
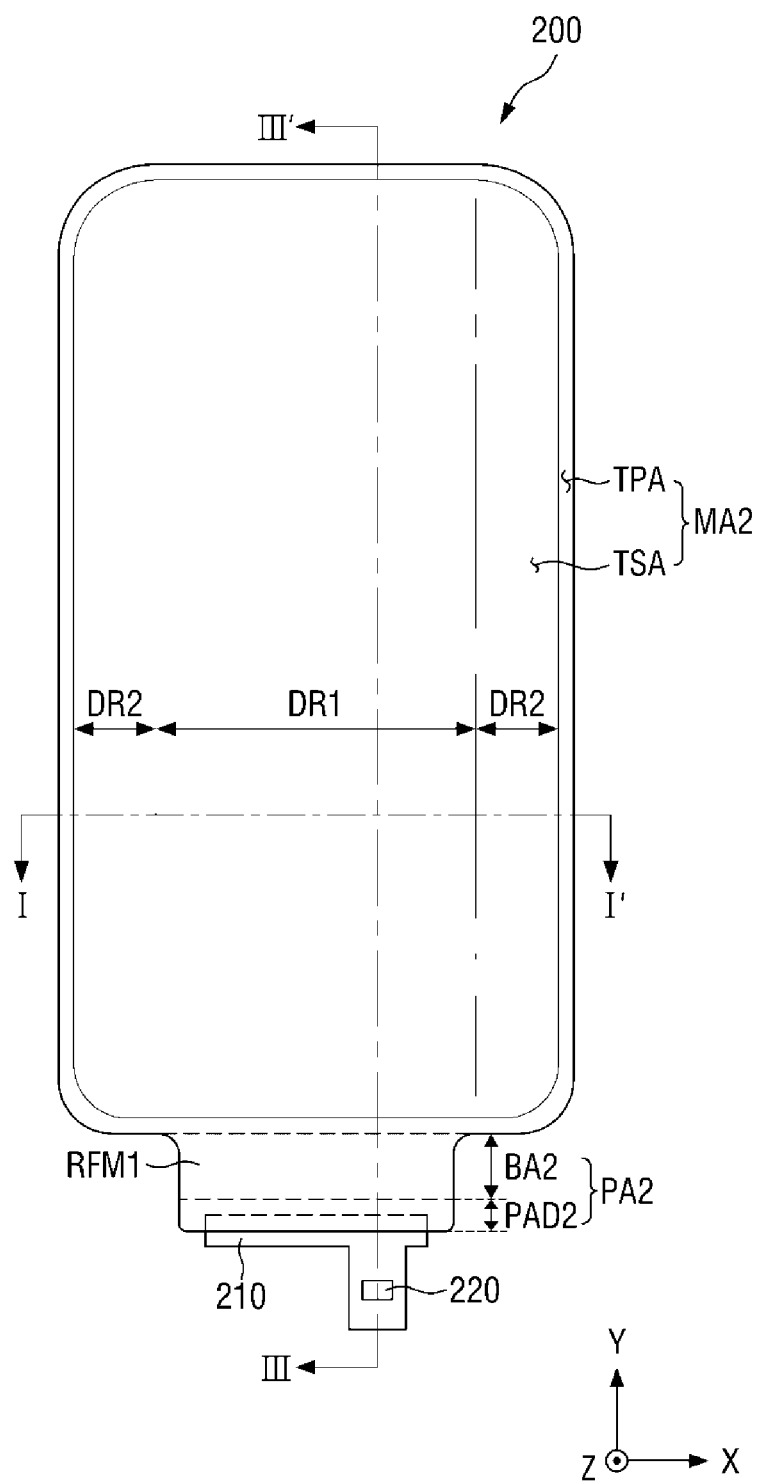
FIG. 4 is a plan view of the touch sensing device of FIG. 2 according to so exemplary embodiments.

Reinforcing members RFM may be disposed on upper and lower surfaces of the side of the touch sensing device 200 to which the touch circuit board 210 is attached. For example, the touch sensing device 200 may include a second protruding area PA2 to which the touch circuit board 210 is attached as illustrated in FIG. 4. A first reinforcing member RFM1 may be disposed on an upper surface of the second protruding area PA2, and a second reinforcing member RFM2 may be disposed on a lower surface of the second protruding area PA2. The second protruding area PA2 of the touch sensing device 200 and the reinforcing members RFM will be described in more detail later.

The touch driver 220 may be disposed on a surface of the touch circuit board 210. The touch driver 220 may transmit touch driving signals to the touch driving electrodes of the touch sensing device 200, sense sensing signals from the touch sensing electrodes of the touch sensing device 200, and calculate (or otherwise determine) a user's touch position by analyzing the sensing signals. The touch driver 220 may be formed as an integrated circuit and mounted on the touch circuit board 210. In some exemplary embodiments, the touch driver 220 may be formed as an integrated circuit and mounted on the display circuit board 310.

The display panel 300 may be disposed under the touch sensing device 200. The display panel 300 may be overlapped by the light transmitting portion DA100 of the cover window 100. The display panel 300 may be disposed in the first area DR1 and the second areas DR2. As such, an image of the display panel 300 may be presented, and, thereby, viewable not only in the first area DR1, but also in the second areas DR2.

The display circuit board 310 may be attached to a side of the display panel 300. The connector CNT may be located on a surface of the display circuit board 310, and the touch connection portion provided at an end of the touch circuit board 210 may be connected to the connector CNT of the display circuit board 310. The display circuit board 310 will be described in more detail later with reference to FIG. 3.

The under-panel member 400 may be disposed under the display panel 300 as illustrated in FIG. 8. The under-panel member 400 may be attached to a lower surface of the display panel 300 by a fourth adhesive member 940. The fourth adhesive member 940 may be an OCA or an OCR, but exemplary embodiments are not limited thereto.

The under-panel member 400 may include at least one of a light absorbing member for absorbing light incident from the outside, a buffer member for absorbing external impact, a heat dissipating member for efficiently dissipating heat of the display panel 300, and a light shielding layer for blocking light incident from the outside.

The light absorbing member may be disposed under the display panel 300. The light absorbing member blocks transmission of light to prevent elements disposed under the light absorbing member, for example, a force sensor (not shown), the display circuit board 310, etc., from being seen from above the display panel 300. The light absorbing member may include a light absorbing material, such as a black pigment and/or dye.

The buffer member may be disposed under the light absorbing member. The buffer member absorbs external impact to prevent the display panel 300 from being damaged. The buffer member may be composed of a single layer or a plurality of layers. For example, the buffer member may be made of polymer resin, such as at least one of polyurethane, polycarbonate, polypropylene, and polyethylene, or may be made of an elastic material, such as at least one of a sponge formed by foaming rubber, a urethane-based material, and an acrylic-based material. The buffer member may be a cushion layer.

The heat dissipating may be disposed under the buffer member. The heat dissipating member may include a first heat dissipating layer containing, for instance, at least one of graphite and carbon nanotubes, and a second heat dissipating layer formed of a metal thin film (such as at least one of copper, nickel, ferrite, and silver) capable of shielding electromagnetic waves and having high thermal conductivity.

The light shielding layer may block transmission of light to prevent elements disposed under the light shielding layer from being seen from above the display panel 300. The light shielding layer may include a light absorbing material, such as a black pigment and/or dye.

The lower cover 900 may be disposed under the under-panel member 400 and may be fastened and fixed to the cover window 100 as illustrated in FIG. 1. The lower cover 900 may form the lower exterior of the display device 10. The lower cover 900 may include plastic and/or metal. In addition, in some exemplary embodiments, a middle frame may be further disposed between the under-panel member 400 and the lower cover 900. In this case, each of the cover window 100 and the lower cover 900 may be coupled to the middle frame.

Figure 3:
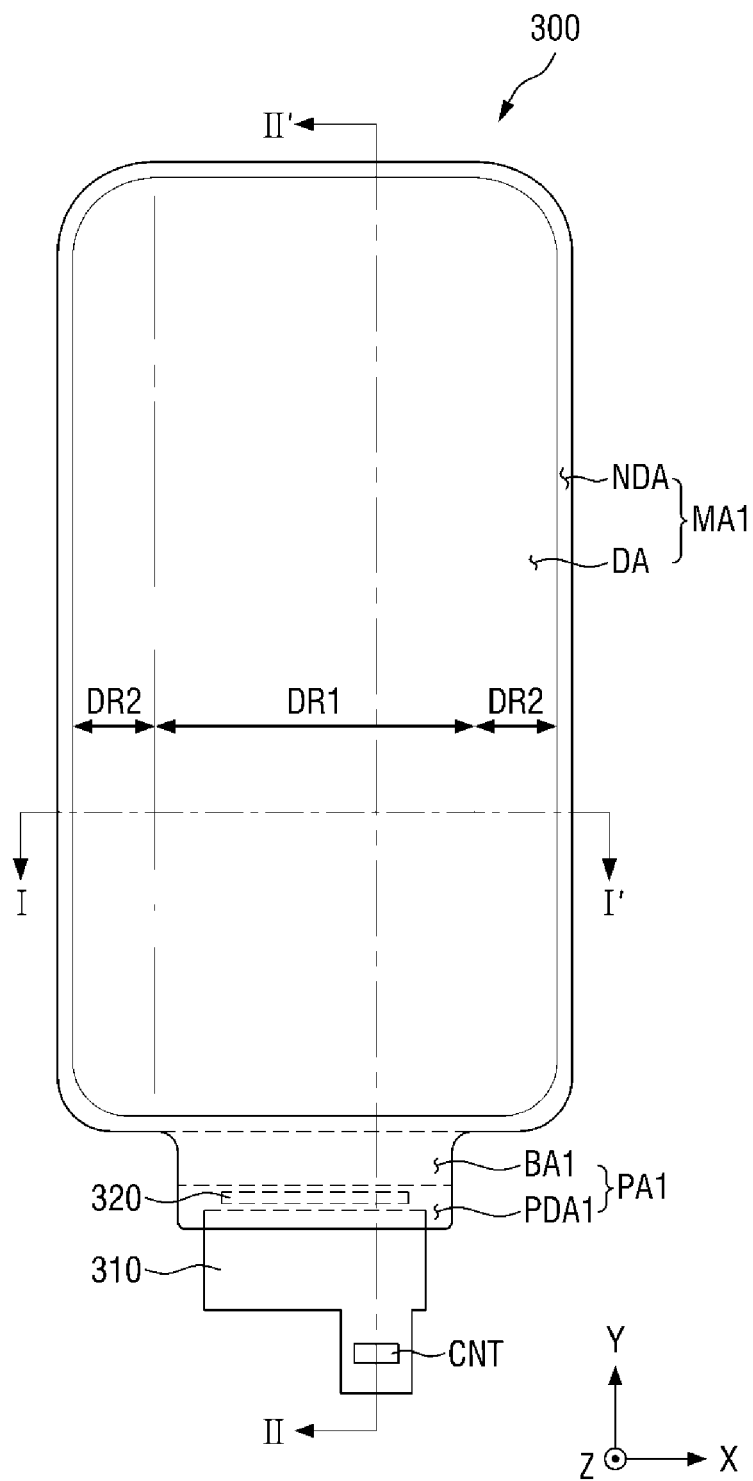
FIG. 3 is a plan view of the display panel of FIG. 2 according to some exemplary embodiments.
Figure 5:
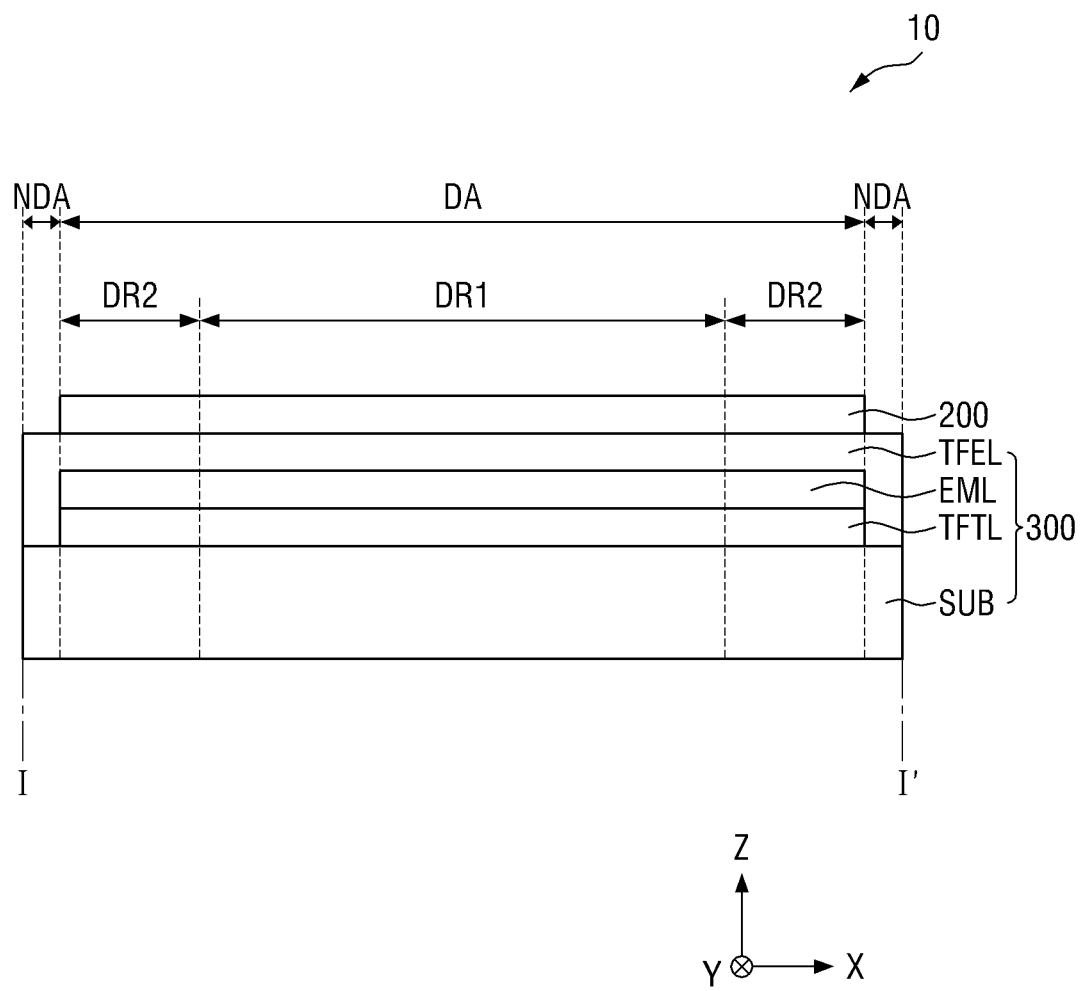
FIG. 5 is a cross-sectional view of the display panel of FIG. 3 and the touch sensing device of FIG. 4 taken along sectional line I-I' according to some exemplary embodiments.

FIG. 3 is a plan view of the display panel of FIG. 2 according to some exemplary embodiments. FIG. 4 is a plan view of the touch sensing device of FIG. 2 according to some exemplary embodiments. FIG. 5 is a cross-sectional view of the display panel of FIG. 3 and the touch sensing device of FIG. 4 taken along sectional line I-I' according to some exemplary embodiments.

Referring to FIG. 3, the display panel 300 may include a first main area MA1 and a first protruding area PA1 protruding from a side of the first main area MA1.

The first main area MA1 may include the first area DR1 formed flat and the second area DR2 extending from each of the left and right sides of the first area DR1. The first main area MA1 may include a display area DA where pixels are formed to display an image and a non-display area NDA around the display area DA.

In the display area DA, not only the pixels, but also scan lines, data lines, and power supply lines connected to the pixels may be disposed. The display area DA may be disposed in the first area DR1, which may be flat, and the second area DR2, which may be a curved portion extending from each of the left and right sides of the first area DR1. In this manner, an image of the display panel 300 can also be seen in the second area DR2.

The non-display area NDA may be defined as an area extending from the outside of the display area DA to edges of the display panel 300. A scan driver for transmitting scan signals to the scan lines and link lines for connecting the data lines and the display driver 320 may be disposed in the non-display area NDA.

The first protruding area PA1 may protrude from a side of the first main area MA1. For example, the first protruding area PA1 may protrude from a lower side of the first main area MA1 in a direction opposite to the second direction (e.g., Y-axis direction). A length of the first protruding area PA1 in the first direction (e.g., X-axis direction) may be smaller than a length of the first main area MA1 in the first direction (e.g., X-axis direction).

The first protruding area PA1 may include a first bending area BA1 and a first pad area PDA1. In this case, the first pad area PDA1 may be disposed on a side of the first bending area BA1, and the first main area MA1 may be disposed on the other side of the first bending area BA1. For example, the first pad area PDA1 may be disposed on a lower side of the first bending area BA1, and the first main area MA1 may be disposed on an upper side of the first bending area BA1.

The display panel 300 may be formed flexible so that it can be curved, bent, folded, flexed, and/or rolled. Therefore, the display panel 300 may be bent in the first bending area BA1 in a direction opposite to a third direction (e.g., Z-axis direction), which is a thickness direction. In this case, a surface of the first pad area PDA1 of the display panel 300 that faces upward before the display panel 300 is bent may face downward after the display panel 300 is bent. Therefore, the first pad area PDA1 may be disposed under the first main area MA1 and overlapped by the first main area MA1. However, exemplary embodiments are not limited to this case. In some exemplary embodiments, the display panel 300 may be bent in the first bending area BA1 in the third direction (e.g., Z-axis direction), which is the thickness direction.

Pads and the display driver 320 may be disposed on the first pad area PDA1 of the display panel 300. The pads may be display pads electrically connected to the display driver 320 and the display circuit board 310. In some exemplary embodiments, the pads may be disposed on a lower surface of the first pad area PDA1. In some exemplary embodiments, the pads may be disposed on an upper surface of the first pad area PDA1 or may be disposed on the upper and lower surfaces of the first pad area PDA1.

The display driver 320 outputs signals and voltages for driving the display panel 300. For example, the display driver 320 may supply data voltages to the data lines. In addition, the display driver 320 may supply power supply voltages to the power supply lines and supply scan control signals to the scan driver. The display driver 320 may be formed as an integrated circuit and mounted on the lower surface or the upper surface of the display panel 300 in the first pad area PDA1 by a chip-on glass (COG) method, a chip-on plastic (COP) method, or an ultrasonic bonding method. However, exemplary embodiments are not limited to this case. In some exemplary embodiments, the display driver 320 may be mounted on the display circuit board 310. In some exemplary embodiments, the display driver 320 may be mounted on the lower surface or the upper surface of the display panel 300 in the first bending area BA1.

The display circuit board 310 may be mounted on the first pad area PDA1 of the display panel 300. The display circuit board 310 may be attached onto the pads using an anisotropic conductive film. In this manner, lead lines of the display circuit board 310 may be electrically connected to the pads. The display circuit board 310 may be a flexible printed circuit board, a printed circuit board, or a flexible film, such as a chip-on-film. The display circuit board 310 may include the connector CNT, and the touch connection portion provided at an end of the touch circuit board 210 may be connected to the connector CNT.

Referring to FIG. 4, the touch sensing device 200 may include a second main area MA2 and the second protruding area PA2 protruding from a side of the second main area MA2.

The second main area MA2 may include a touch sensing area TSA and a touch peripheral area TPA. In some exemplary embodiments, the touch sensor area TSA may overlap the display area DA of the display panel 300. For example, the touch sensor area TSA may overlap the first area DR1, which may be flat, and the second areas DR2, which are curved portions extending from each of the left and right sides of the first area DR1. However, exemplary embodiments are not limited to this case. For example, the touch sensor area TSA may overlap only the first area DR1. In addition, in some exemplary embodiments, the touch peripheral area TPA may overlap the non-display area NDA of the display panel 300. In some exemplary embodiments, the touch peripheral area TPA may also overlap a part of the display area DA of the display panel 300.

In some exemplary embodiments, touch electrodes may be disposed in the touch sensor area TSA, and touch lines may be disposed in the touch peripheral area TPA. The touch electrodes may be diamond-shaped in a plan view. However, the planar shape of the touch electrodes is not limited to the diamond shape, and the touch electrodes may also have various shapes, such as a circular shape, a square shape, etc. In addition, in some exemplary embodiments, the touch electrodes may have a mesh structure.

The second protruding area PA2 may protrude from a side of the second main area MA2. For example, the second protruding area PA2 may protrude from a lower side of the second main area MA2 in the direction opposite to the second direction (e.g., Y-axis direction). A length of the second protruding area PA2 in the first direction (e.g., X-axis direction) may be smaller than a length of the second main area MA2 in the first direction X-axis direction). In some exemplary embodiments, the second protruding PA2 may overlap the first protruding area PA1 in the third direction (e.g., Z-axis direction). In some exemplary embodiments, the second protruding area PA2 and the first protruding area PA1 may be disposed in different areas in the third direction (e.g., Z-axis direction) and may not overlap each other.

The second protruding area PA2 may include a second bending area BA2 and a second pad area PDA2. In this case, the second pad area PDA2 may be disposed on a side of the second bending area BA2, and the second main area MA2 may be disposed on the other side of the second bending area BA2. For example, the second pad area PDA2 may be disposed on a lower side of the second bending area BA2, and the second main area MA2 may be disposed on an upper side of the second bending area BA2.

The second bending area BA2 may overlap the first bending area BA1 in the third direction (e.g., Z-axis direction). In some exemplary embodiments, a width of the second bending area BA2 in the second direction (e.g., Y-axis direction) may be greater than a width of the first bending area BA1 in the second direction (e.g., Y-axis direction) in view of the fact that the second bending area BA2 of the touch sensing device 200 is bent outside the first bending area BA1 of the display panel 300. In some exemplary embodiments, the width of the second bending area BA2 in the second direction (e.g., Y-axis direction) may be equal to the width of the first bending area BA1 in the second direction (e.g., Y-axis direction).

The touch sensing device 200 may be formed flexible so that it can be curved, bent, folded, flexed, and/or rolled. Therefore, the touch sensing device 200 may be bent in the second bending area BA2 in the direction opposite to the third direction (e.g., Z-axis direction), which is the thickness direction. In this case, a surface of the second pad area PDA2 of the touch sensing device 200 that faces upward before the touch sensing device 200 is bent may face downward after the touch sensing device 200 is bent. Therefore, the second pad area PDA2 may be disposed under the second main area MA2 and overlapped by the second main area MA2.

Pads may be disposed on the second pad area PDA2 of the touch sensing device 200. The pads may be touch pads electrically connected to the touch electrodes. In some exemplary embodiments, the pads may be disposed on a lower surface of the second pad area PDA2. In some exemplary embodiments, the pads may be disposed on an upper surface of the second pad area PDA2 or may be disposed on the upper and lower surfaces of the second pad area PDA2.

The touch circuit board 210 may be attached onto the pads using an anisotropic conductive film, but exemplary embodiments are not limited thereto. In this manner, lead lines s of the touch circuit board 210 may be electrically connected to the pads. The touch circuit board 210 may be a flexible printed circuit board, a printed circuit board, or a flexible film, such as a chip-on-film.

The touch driver 220 may be connected to the touch electrodes of the touch sensing device 200. The touch driver 220 transmits driving signals to the touch electrodes and measures capacitance values of the touch electrodes. Each of the driving signals may be a signal having a plurality of driving pulses. Based on the capacitance values, the touch driver 220 may not only determine whether a touch input has been made, but also calculate (or otherwise determine) touch coordinates of the touch input. The touch driver 220 may be mounted on the touch circuit board 210. However, exemplary embodiments are not limited to this case. In some exemplary embodiments, the touch driver 220 may be formed as an integrated circuit and mounted on a lower surface or an upper surface of the touch sensing device 200 in the second pad area PDA2 by a COG method, a COP method, or an ultrasonic bonding method. In some exemplary embodiments, the touch driver 220 may be mounted on the display circuit board 310.

The reinforcing members RFM may be disposed in the second protruding area PA2 of the touch sensing device 200. For example, the first reinforcing member RFM1 may be disposed on the upper surface of the second protruding area PA2 of the touch sensing device 200. In addition, as illustrated in FIG. 7, the second reinforcing member RFM2 may be disposed on the lower surface of the second protruding area PA2 of the touch sensing device 200.

The first reinforcing member RFM1 may be disposed in the second bending area BA2 and the second pad area PDA2. For example, the first reinforcing member RFM1 may cover a part of the touch circuit board 210 disposed in the second bending area BA2 and the second pad area PDA2. When the first reinforcing member RFM1 covers a part of the touch circuit board 210, the connection between the touch circuit board 210 and the second pad area PDA2 of the touch sensing device 200 may be reinforced. However, exemplary embodiments are not limited to this case. In some exemplary embodiments, the first reinforcing member RFM1 may be disposed in the second bending area BA2 and the second pad area PDA2, but may not cover the touch circuit board 210 or may be disposed only in the second bending area BA2. In FIG. 4, a length of the first reinforcing member RFM1 in the first direction (e.g., X-axis direction) and a length of the second protruding area PA2 in the first direction (e.g., X-axis direction) are equal. However, this is merely an example, and the length of the first reinforcing member RFM1 in the first direction (e.g., X-axis direction) and the length of the second protruding area PA2 in the first direction (e.g., X-axis direction) may be different. For example, the length of the first reinforcing member RFM1 in the first direction (e.g., X-axis direction) may be smaller than the length of the second protruding area PA2 in the first direction (e.g., X-axis direction), or the length of the first reinforcing member RFM1 in the first direction (e.g., X-axis direction) may be greater than the length of the second protruding area PA2 in the first direction (e.g., X-axis direction).

Figure 7:
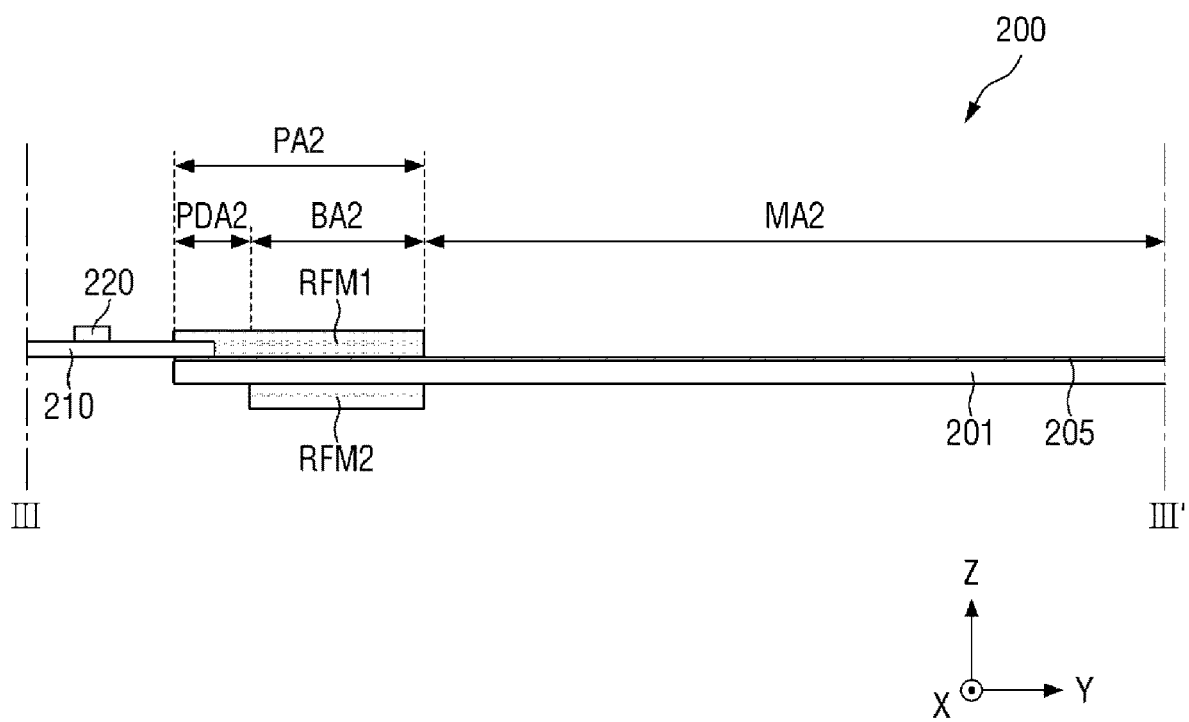
FIG. 7 is a cross-sectional view of the touch sensing device of FIG. 4 taken along sectional line III-III' of FIG. 4 according to some exemplary embodiments.

As illustrated in FIG. 7, the second reinforcing member RFM2 may be disposed in the second bending area BA2. However, exemplary embodiments are not limited to this case. In some exemplary embodiments, the second reinforcing member RFM2 may be disposed in the second bending area BA2 and a part of the second pad area PDA2.

In some exemplary embodiments, a length of the second reinforcing member RFM2 in the first direction (e.g., X-axis direction) and the length of the second protruding area PA2 in the first direction (e.g., X-axis direction) may be equal. However, the length of the second reinforcing member RFM2 in the first direction (e.g., X-axis direction) and the length of the second protruding area PA2 in the first direction (e.g., X-axis direction) may be different. For example, the length of the second reinforcing member RFM2 in the first direction (e.g., X-axis direction) may be smaller than the length of the second protruding area PA2 in the first direction (e.g., X-axis direction), or the length of the second reinforcing member RFM2 in the first direction (e.g., X-axis direction) may be greater than the length of the second protruding area PA2 in the first direction (e.g., X-axis direction).

In some exemplary embodiments, lengths of the first reinforcing member RFM1 and the second reinforcing member RFM2 in the second direction (e.g., Y-axis direction) may be different from each other. For example, the length of the first reinforcing member RFM1 in the second direction (e.g., Y-axis direction) may be greater than the length of the second reinforcing member RFM2 in the second direction (e.g., Y-axis direction). However, if the touch circuit board 210 is attached to the lower surface of the second pad area PDA2, the length of the second reinforcing member RFM2 in the second direction (e.g., Y-axis direction) may be greater than the length of the first reinforcing member RFM1 in the second direction (e.g., Y-axis direction). In addition, in some exemplary embodiments, the lengths of the first reinforcing member RFM1 and the second reinforcing member RFM2 in the second direction (e.g., Y-axis direction) may be the same.

When the second bending area BA2 of the touch sensing device 200 is bent, the first reinforcing member RFM1 and the second reinforcing member RFM2 cause the second bending area BA2 of the touch sensing device 200 to be positioned adjacent to a neutral plane. The neutral plane may be a plane that is subjected to substantially "zero" stress because compressive stress and tensile stress of the same magnitude are applied to the plane. When the second bending area BA2 of the touch sensing device 200 is positioned adjacent to the neutral plane, the bending stress of the touch sensing device 200 can be minimized (or at least reduced), thereby minimizing (or at least reducing) damage to the second bending area BA2 of the touch sensing device 200. Accordingly, since a side of the touch sensing device 200 to which the touch circuit board 210 is connected can be stably bent, a light shielding area NDA100 of the display device 10 can be reduced.

In some exemplary embodiments, the reinforcing members RFM may be made of resin or an organic material. In some exemplary embodiments, the reinforcing members RFM may be made of dry film resist (DFR). In some exemplary embodiments, the reinforcing members RFM may be applied to the second protruding area PA2. In some exemplary embodiments, the reinforcing members RFM may be formed as film layers and placed in the second protruding area PA2.

FIG. 5 is a cross-sectional view of the display panel of FIG. 3 and the touch sensing device of FIG. 4 taken along sectional line I-I' according to some exemplary embodiments.

Referring to FIG. 5, in some exemplary embodiments, the display device 10 may include the display panel 300 and the touch sensing device 200 disposed on the display panel 300.

The display panel 300 may include a substrate SUB, a thin-film transistor layer TFTL disposed on the substrate SUB, a light emitting element layer EML, and a thin-film encapsulation layer TFEL.

The substrate SUB may be made of an insulating material, such as glass, quartz, and/or polymer resin. The polymer material may be, for example, at least one of polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and any combination of the same. Alternatively, the first substrate SUB1 may include a metal material.

The substrate SUB may be a rigid substrate and/or a flexible substrate that can be curved, bent, folded, flexed, and/or rolled. When the substrate SUB is a flexible substrate, it may be made of, but not limited to, polyimide (PI).

The thin-film transistor layer TFTL may be disposed on the substrate SUB. The thin-film transistor layer TFTL may include not only respective thin-film transistors of (or for) pixels, but also scan lines, data lines, power supply lines, scan control lines, and routing lines connecting pads and data lines. Each of the thin-film transistors may include a gate electrode, a semiconductor layer, a source electrode, and a drain electrode. When the scan driver is formed in the non-display area NDA of the display panel 300, it may include thin-film transistors, which may be formed in a same process as the thin-film transistors of the pixels.

The thin-film transistor layer TFTL may be disposed in the display area DA and the non-display area NDA. For instance, the respective thin-film transistors of the pixels, the scan lines, the data lines, and the power supply lines in the thin-film transistor layer TFTL may be disposed in the first area. DR1 and the second area DR2 of the display area DA. The scan control lines and the link lines of the thin-film transistor layer TFTL may be disposed in the non-display area NDA.

The light emitting element layer EML may be disposed on the thin-film transistor layer TFTL. The light emitting element layer EML may include the pixels, each including a first electrode, a light emitting layer, and a second electrode, and a bank layer defining the pixels. The light emitting layer EML may be an organic light emitting layer including an organic material. In this case, the light emitting layer EML may include a hole transporting layer, an organic light emitting layer, and an electron transporting layer. When a predetermined voltage is applied to the first electrode and a cathode voltage is applied to the second electrode through at least one thin-film transistor of the thin-film transistor layer TFTL, holes and electrons move to the organic light emitting layer respectively through the hole transporting layer and the electron transporting layer and combine together in the organic light emitting layer, thereby emitting light. The pixels of the light emitting element layer EML may be disposed in the display area DA.

The thin-film encapsulation layer TFEL may be disposed on the light emitting element layer EML. The thin-film encapsulation layer TFEL prevents oxygen and/or moisture from permeating the light emitting element layer EML. To this end, the thin-film encapsulation layer TFEL may include at least one inorganic layer. The inorganic layer may be, but is not limited to, at least one of a silicon nitride layer, a silicon oxynitride layer, a silicon oxide layer, a titanium oxide layer, and an aluminum oxide layer. In addition, the thin-film encapsulation layer TFEL protects the light emitting element layer EML from foreign matter, such as dust. To this end, the thin-film encapsulation layer TFEL may include at least one organic layer. The organic layer may be, but is not limited to, at least ones of acryl resin, epoxy resin, phenolic resin, polyamide resin, and polyimide resin.

The thin-film encapsulation layer TFEL may be disposed in both the display area DA and the non-display area NDA. For instance, the thin-film encapsulation layer TFEL may cover the light emitting element layer EML of the display area DA and the non-display area NDA and cover the thin-film transistor layer TFTL of the non-display area NDA.

The touch sensing device 200 may be disposed on the thin-film encapsulation layer TFEL. For example, the touch sensing device 200 may be formed as a separate touch panel and then attached onto the thin-film encapsulation layer TFEL. In some exemplary embodiments, the touch sensing device 200 may be disposed directly on the thin-film encapsulation layer TFEL. In this case, the thickness of the display device 10 can be reduced and the touch sensing device 200 may be formed in a continuous process with the display panel 300.

The touch sensing device 200 may include the touch electrodes for sensing a user's touch interaction using a capacitance method and include the touch lines connecting the pads and the touch electrodes. For example, the touch sensing device 200 may sense a user's touch using a self-capacitance method or a mutual capacitance method.

The touch electrodes of the touch sensing device 200 may be disposed in the touch sensor area TSA, of FIG. 4 which overlaps the display area DA, and the touch lines of the touch sensing device 200 may be disposed in the touch peripheral area TPA of FIG. 4, which overlaps the non-display area NDA.

Figure 6:
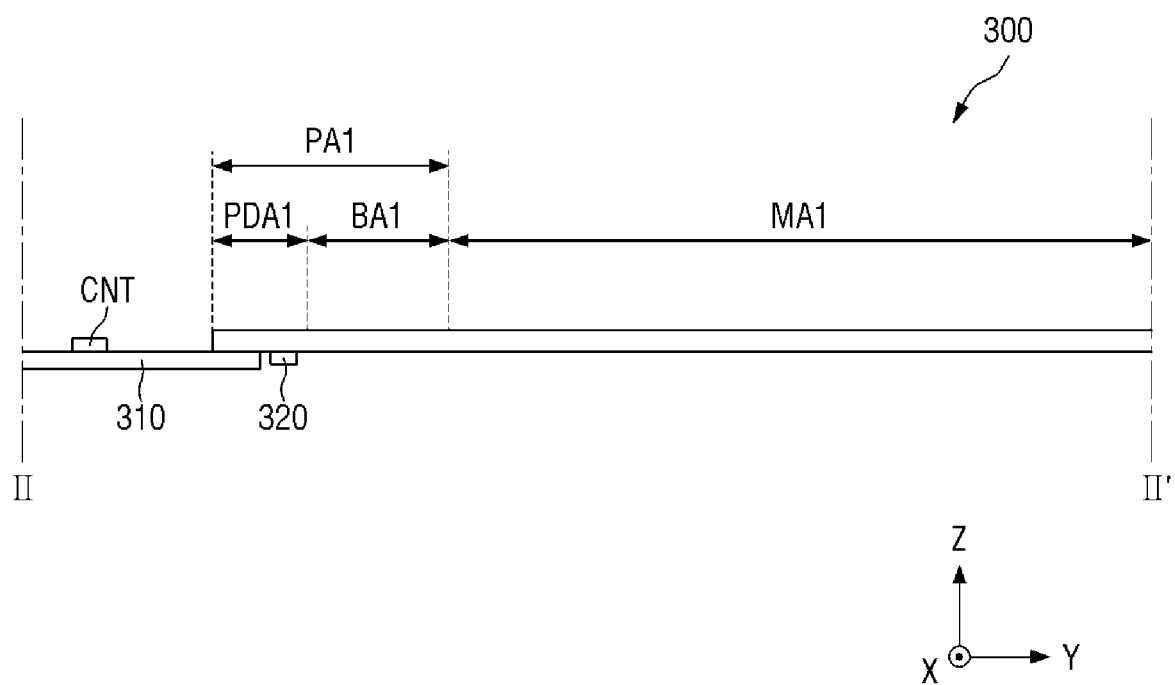
FIG. 6 is a cross-sectional view of the display panel of FIG. 3 taken along sectional line II-II' according to some exemplary embodiments.

FIG. 6 is a cross-sectional view of the display panel of FIG. 3 taken along sectional line II-II' according to some exemplary embodiments. FIG. 7 is a cross-sectional view of the touch sensing device of FIG. 4 taken along sectional line III-III' of FIG. 4 according to some exemplary embodiments. FIG. 8 is a cross-sectional view of the display device of FIG. 2 taken along sectional line A-A' according to some exemplary embodiments. Since the elements of the display device 10 illustrated in FIG. 8 have been described with reference to FIGS. 1 through 4, a redundant descriptions is primarily omitted.

Referring to FIGS. 6 and 8 together, the display panel 300 may include the first main area MA1 and the first protruding area PA1 protruding from the first main area MA1 in the direction opposite to the second direction (e.g., Y-axis direction).

The first protruding area PA1 may include the first bending area BA1 and the first pad area PDA1. For instance, the first bending area BA1 is disposed between the first pad area PDA1 and the first main area MA1 and refers to an area that is substantially bent in the first protruding area PA1. As the first bending area BA1 is bent, the first pad area PDA1 may be located under the first main area MA1, and the first pad area PDA1 and the first main area MA1 may overlap each other in the third direction (e.g., Z-axis direction). Accordingly, since the display circuit board 310 is connected to the first pad area PDA1 located under the first main area MA1, the non-display area NDA of the display panel 300 can be reduced.

The display driver 320 may be located in the first pad area PAD1. For example, the display driver 320 may be located between the first bending area BA1 and the pads, and mounted on the lower surface of the first pad area PDA1. In some exemplary embodiments, the display driver 320 may be disposed on the display circuit board 310. As the first bending area BA1 is bent, the display driver 320 may be located under the first main area MA1, and the display driver 320 and the first main area MA1 may overlap each other in the third direction (e.g., Z-axis direction).

The display circuit board 310 may be mounted on the first pad area PDA1 of the display panel 300. For example, the display circuit board 310 may be mounted on the lower surface of the first pad area PDA1. The display circuit board 310 may be attached onto the pads using an anisotropic conductive film, but exemplary embodiments are not limited thereto. The display circuit board 310 may include the connector CNT. As described above, as the first bending area BA1 is bent, the first pad area PDA1 may be located under the first main area MA1, and a connecting area of the first pad area PDA1 and the display circuit board 310 may be located under the first main area MA1. The connector CNT of the display circuit board 310 may be disposed under the first main area MA1 and may be exposed so that the touch connection portion provided at an end of the touch circuit board 210 can be connected to the connector CNT. In addition, as described above, in some exemplary embodiments, the under-panel member 400 may be located between the first main area MA1 of the display panel 300 and the display circuit board 310.

Referring to FIGS. 7 and 8 together, the touch sensing device 200 may include the second main area MA2 and the second protruding area PA2 protruding from the second main area MA2 in the direction opposite to the second direction (e.g., Y-axis direction). In some exemplary embodiments, the length of the second protruding area PA2 in the direction opposite to the second direction (e.g., Y-axis direction) may be greater than the length of the first protruding area PA1 in the direction opposite to the second direction (e.g., Y-axis direction) in view of the fact that the second protruding area PA2 of the touch sensing device 200 is bent outside the first protruding area PA1 of the display panel 300.

The second main area MA2 and the second protruding area PA2 of the touch sensing device 200 may include a base layer 201 and a touch electrode layer 205. For example, the base layer 201 may be a flexible layer that can be curved, bent, folded, flexed, and/or rolled. For example, the base layer 201 may include polyimide (PI), but exemplary embodiments are not limited thereto. In addition, the base layer 201 may be transparent in order to transmit an image output from the display panel 300.

The touch electrode layer 205 may include the touch electrodes and the touch lines. The touch electrodes may be diamond-shaped in a plan view. However, the planar shape of the touch electrodes is not limited to the diamond shape and can be changed to various shapes, such as a triangle, a quadrilateral other than a diamond, a pentagon, a circle, a bar, etc. The touch electrodes may include a conductive material. For example, the conductive material nay include a metal or an alloy of metals. Examples of the metal may include at least one of gold (Au), silver, (Ag), aluminum (Al), molybdenum (Mo), chromium (Cr), titanium (Ti), nickel (Ni), neodymium (Nd), copper (Cu), and platinum (Pt). In addition, the touch electrodes may be made of a transparent conductive material. Examples of the conductive material may include at least one of silver nanowires (AgNWs), indium tin oxide (ITO), indium zinc oxide (IZO), antimony zinc oxide (AZO), indium tin zinc oxide (ITZO), zinc oxide (ZnO), tin oxide ($SnO_2$), carbon nanotubes, and graphene.

In some exemplary embodiments, the touch electrodes may have a single-layer structure or a multilayer structure. When the touch electrodes have a multilayer structure, they may include a plurality of metal layers. For example, the touch electrodes may have a three-layer structure of titanium/aluminum/titanium.

In some exemplary embodiments, the touch electrodes may have a mesh structure in order not to be visible (or less visible) to a user. When the touch electrodes have a mesh structure, they may be disposed not to overlap light emitting areas of the display panel 300. In other words, mesh holes overlapping the light emitting areas may be defined in the touch electrodes having a mesh structure.

The second protruding area PA2 may include the second bending area BA2 and the second pad area PDA2. For instance, the second bending area BA2 may be disposed between the second pad area PDA2 and the second main area MA2 and refers to an area that is substantially bent in the second protruding area PA2. As the second bending area BA2 is bent, the second pad area PDA2 may be located under the second main area MA2, and the second pad area PDA2 and the second main area MA2 may overlap each other in the third direction (e.g., Z-axis direction). Accordingly, since the touch circuit board 210 is connected to the second pad area PDA2 located under the second main area MA2, the second pad area PDA2 of the touch sensing device 200 can be prevented from being seen in the light transmitting area DA100, thereby reducing the light shielding area NDA100.

The touch circuit board 210 may be mounted on the second pad area PDA2 of the touch sensing device 200. For example, the touch circuit board 210 may be mounted on an upper surface of the touch electrode layer 205 in the second pad area PDA2. The touch circuit board 210 may be attached onto the pads using an anisotropic conductive film, but exemplary embodiments are not limited thereto.

As the second bending area BA2 of the touch sensing device 200 is bent, the second pad area PDA2 may be disposed under the second main area MA2, and a connecting area of the second pad area PDA2 and the touch circuit board 210 may be located under the second main area MA2. For instance, as for the arrangement of the touch sensing device 200 and the display panel 300 in the display device 10, the touch sensing device 200 may be located on the display panel 300. Here, the second bending area BA2 of the touch sensing device 200 may be located outside the first bending area BA1 of the display panel 300, and the second pad area PDA2 of the touch sensing device 200 may be located under the first pad area PDA1 of the display panel 300.

When bent, the first bending area BA1 and the second bending area BA2 may overlap each other in the second direction (e.g., Y-axis direction), and the first pad area PDA1 and the second pad area PDA2 may overlap each other in the third direction (e.g., Z-axis direction). In addition, a length of the second bending area BA2 extending in the second direction (e.g., Y-axis direction) may be, but is not limited to being, greater than a length of the first bending area BA1 in the second direction (e.g., Y-axis direction).

In some exemplary embodiments, the touch driver 220 may be disposed on the touch circuit board 210. As the second bending area BA2 is bent, the touch circuit board 210 may be disposed under the display circuit board 310, and a connection portion of the touch circuit board 210 may be connected to the connector CNT of the display circuit board 310.

The reinforcing members RFM may be disposed in the second protruding area PA2 of the touch sensing device 200. For example, the first reinforcing member RFM1 may be disposed on the upper surface of the touch electrode layer 205 in the second protruding area PA2 of the touch sensing device 200, and the second reinforcing member RFM2 may be disposed on a lower surface of the base layer 201 in the second protruding area PA2 of the touch sensing device 200.

The first reinforcing member RFM1 may be disposed in the second bending area BA2 and the second pad area PDA2. For example, the first reinforcing member RFM1 may cover the second bending area BA2 and a part of the touch circuit board 210 disposed in the second pad area PDA2. When the first reinforcing member RFM1 covers a part of the touch circuit board 210, the connection between the touch circuit board 210 and the second pad area PDA2 of the touch sensing device 200 can be reinforced. The second reinforcing member RFM2 may be disposed in the second bending area BA2. However, exemplary embodiments are not limited to this case. In some exemplary embodiments, the second reinforcing member RFM2 may be disposed in the second bending area BA2 and a part of the second pad area PDA2.

In some exemplary embodiments, the lengths of the first reinforcing member RFM1 and the second reinforcing member RFM2 in the second direction (e.g., Y-axis direction) may be different from each other. For example, the length of the first reinforcing member RFM1 in the second direction (e.g., Y-axis direction) may be greater than the length of the second reinforcing member RFM2 in the second direction (e.g., Y-axis direction). In addition, although the first reinforcing member RFM1 and the second reinforcing member RFM2 have the same thickness in the third direction (e.g., Z-axis direction) in FIG. 7, this is merely an example. In some exemplary embodiments, the thickness of the first reinforcing member RFM1 in the third direction (e.g., Z-axis direction) may be greater than the thickness of the second reinforcing member RFM2 in the third direction (e.g., Z-axis direction) so that the touch electrode layer 205 can be positioned adjacent to a neutral plane. In addition, in some exemplary embodiments, a modulus (e.g., elastic modulus, Young's modulus, flexural modulus, tensile modulus, and/or the like) of the first reinforcing member RFM1 may be relatively greater than a modulus of the second reinforcing member RFM2 so that the touch electrode layer 205 can be positioned adjacent to the neutral plane.

Although each of the first reinforcing member RFM1 and the second reinforcing member RFM2 is composed of a single layer in FIG. 7, this is merely an example. Each of the first reinforcing member RFM1 and the second reinforcing member RFM2 may also be composed of a plurality of layers.

As described above, the first reinforcing member RFM1 and the second reinforcing member RFM2 may be bent when the second bending area BA2 of the touch sensing device 200 is bent and may cause the second bending area BA of the touch sensing device 200 to be positioned adjacent to the neutral plane in order to prevent damage due to bending. In addition, the first reinforcing member RFM1 may extend from the second bending area BA2 to the second pad area PDA2 and cover attached portions of the touch circuit board 210 and the pads, thereby stably connecting the touch circuit board 210 and the pads. It is also noted that the first bending area BA1 and the second bending area BA2 may form a bending area BA of the display device 10, and the first pad area PDA1 and the second pad area PDA2 may form a pad area PDA of the display device 10.

Figure 9:
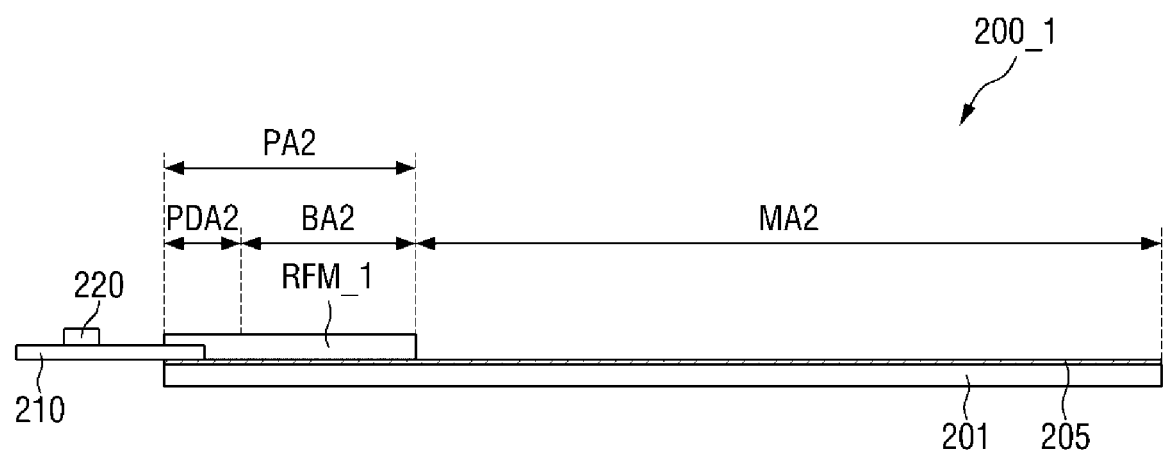
FIG. 9 is a cross-sectional view of a touch sensing device according to some exemplary embodiments.
Figure 10:
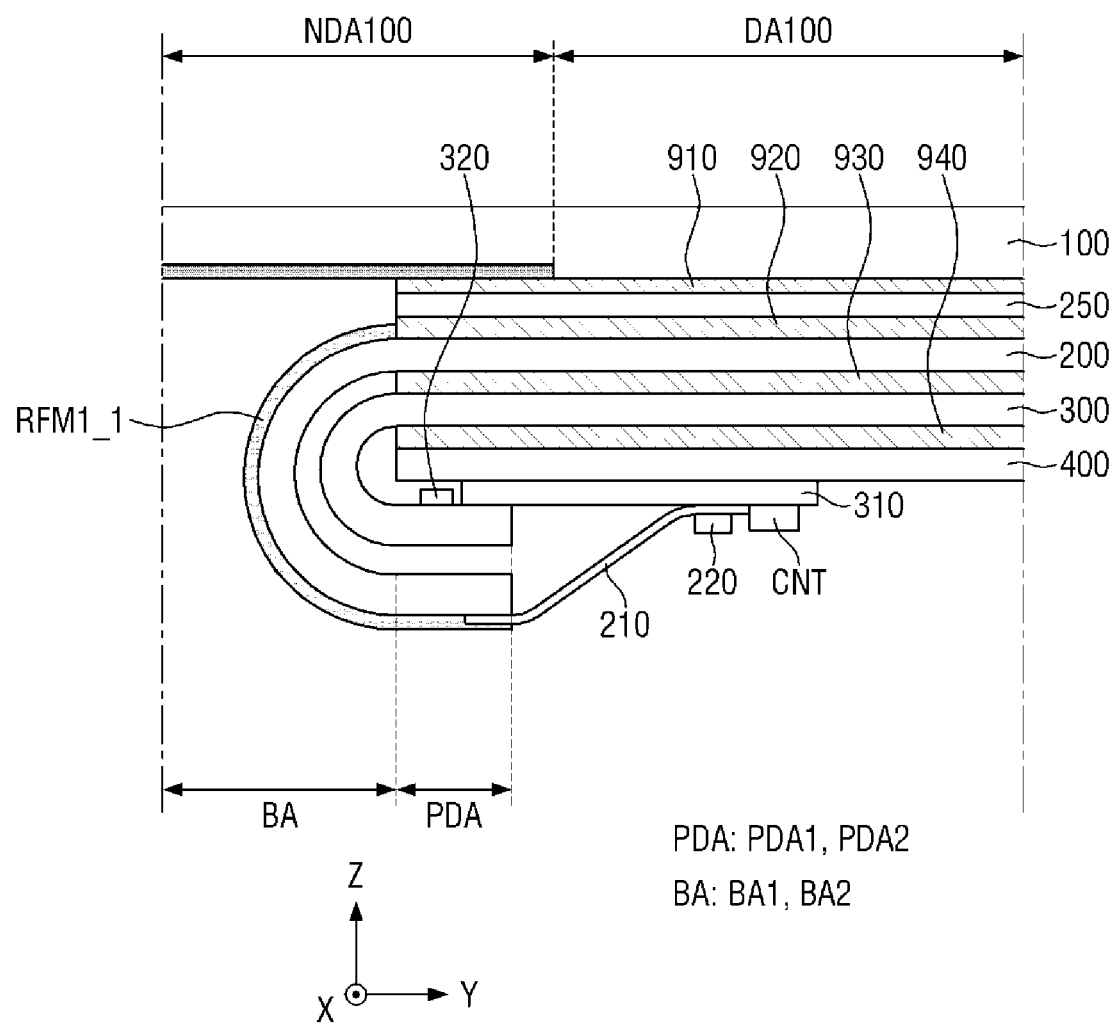
FIG. 10 is a cross-sectional view illustrating a structure of the touch sensing device of FIG. 9 in a bent state according to some exemplary embodiments.

FIG. 9 is a cross-sectional view of a touch sensing device according to some exemplary embodiments. FIG. 10 is a cross-sectional view illustrating a structure of the touch sensing device of FIG. 9 in a bent state according to some exemplary embodiments. The exemplary embodiments described in association with FIGS. 9 and 10 are different from the exemplary embodiments described in association with FIGS. 7 and 8 in that a reinforcing member RFM_1 is disposed only on an upper surface of a second protruding area PA2 and the second reinforcing member RFM2 is omitted. A redundant description of elements and features identical to those of the exemplary embodiments described in association with FIGS. 7 and 8 will be primarily omitted, and differences will be mainly described below.

Referring to FIGS. 9 and 10, the touch sensing device 200_1 may include a second main area MA2 and the second protruding area PA2 protruding from the second main area MA2 in the direction opposite to the second direction (e.g., Y-axis direction). The reinforcing member RFM_1 may be disposed in the second protruding area PA2 of the touch sensing device 200_1. For example, the reinforcing member RFM_1 may be disposed only on an upper surface of a touch electrode layer 205 in the second protruding area PA2 of the touch sensing device 200_1.

The reinforcing member RFM_1 may be disposed in a second bending area BA2 and a second pad area PDA2. For example, the reinforcing member RFM_1 may cover the second bending area BA2 and a part of a touch circuit board 210 disposed in the second pad area PDA2.

The reinforcing member RFM_1 may be bent when the second bending area BA2 of the touch sensing device 200_1 is bent and may cause the second bending area BA of the touch sensing device 200_1 to be positioned adjacent to a neutral plane in order to prevent damage due to bending. In addition, the reinforcing member RFM_1 may cover attached portions of the touch circuit board 210 and pads, thereby stably connecting the touch circuit board 210 and the pads.

Figure 11:
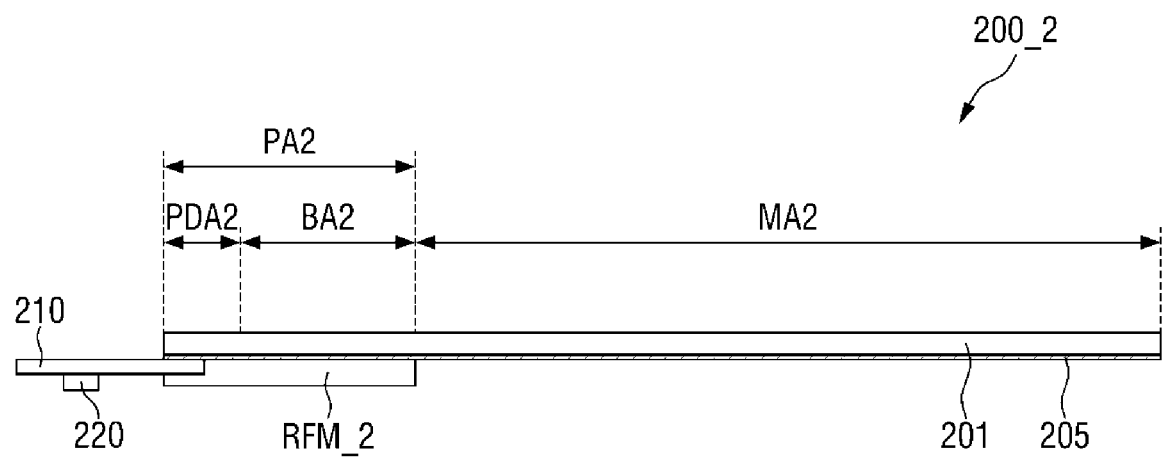
FIG. 11 is a cross-sectional view of a touch sensing device according to some exemplary embodiments.
Figure 12:
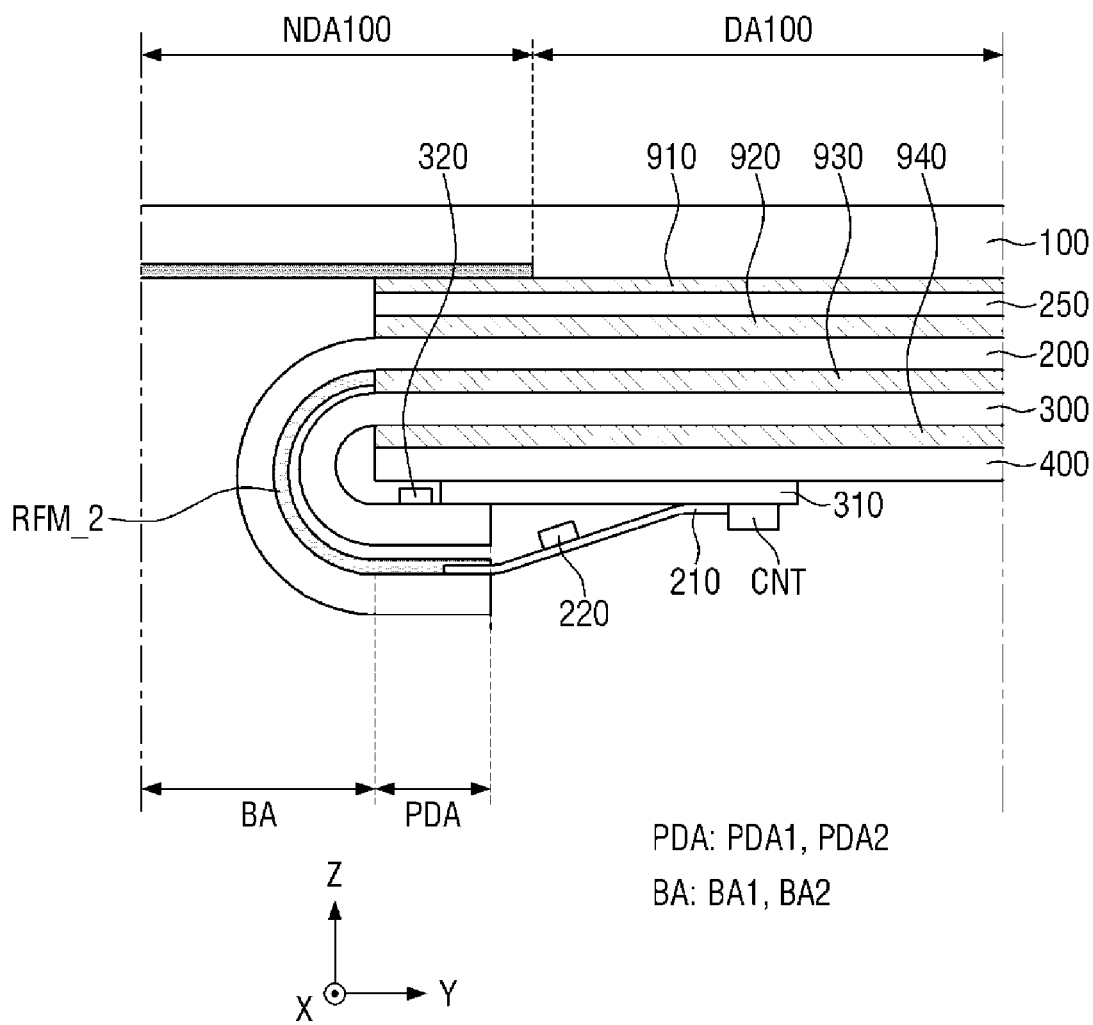
FIG. 12 is a cross-sectional view illustrating a structure of the touch sensing device of FIG. 11 in a bent state according to some exemplary embodiments.

FIG. 11 is a cross-sectional view of a touch sensing device according to some exemplary embodiments. FIG. 12 is a cross-sectional view illustrating a structure of the touch sensing device of FIG. 11 in a bent state according to some exemplary embodiments. The exemplary embodiments described in association with FIGS. 11 and 12 are different from the exemplary embodiments described in association with FIGS. 7 and 8 in that a touch electrode layer 205 is disposed under a base layer 201, and a reinforcing member RFM_2 is disposed only on a lower surface of a second protruding area PA2. A redundant description of elements and features identical to those of the exemplary embodiments described in association with FIGS. 7 and 8 will be primarily omitted, and differences will be mainly described below.

Referring to FIGS. 11 and 12, the touch sensing device 200_2 may include a second main area MA2 and the second protruding area PA2 protruding from the second main area MA2 in the direction opposite to the second direction (e.g., Y-axis direction). The second main area MA2 and the second protruding area PA2 of the touch sensing device 200_2 may include the base layer 201 and the touch electrode layer 205 disposed under the base layer 201.

A touch circuit board 210 may be mounted in a second pad area PDA2 of the touch sensing device 200_2. For example, the touch circuit board 210 may be mounted on a lower surface of the touch electrode layer 205 in the second pad area PDA2.

The reinforcing member RFM_2 may be disposed in the second protruding area PA2 of the touch sensing device 200_2. For example, the reinforcing member RFM_2 may be disposed only on the lower surface of the touch electrode layer 205 in the second protruding area PA2 of the touch sensing device 200_2.

The reinforcing member RFM_2 may be disposed in a second bending area BA2 and the second pad area PDA2. For example, the reinforcing member RFM_2 may cover the second bending area BA2 and a part of the touch circuit board 210 disposed in the second pad area PDA2.

A touch driver 220 may be disposed on a lower surface of the touch circuit board 210. When the second bending area BA2 is bent, the touch driver 220 may be located between the touch circuit board 210 and a display circuit board 310. In this case, the damage to the touch driver 220 by an external force can be prevented.

The reinforcing member RFM_2 may be bent when the second bending area BA2 of the touch sensing device 200_2 is bent and may cause the second bending area BA of the touch sensing device 200_2 to be positioned adjacent to a neutral plane in order to prevent damage due to bending. In addition, the reinforcing member RFM_2 may cover attached portions of the touch circuit board 210 and pads, thereby stably connecting the touch circuit board 210 and the pads. Further, when the touch electrode layer 205 is subjected to compressive stress by being bent inside the base layer 201, the stress of the touch electrode layer 205 is reduced as compared with when the touch electrode layer 205 is subjected to tensile stress by being bent outside the base layer 201. Therefore, damage to the touch electrode layer 205 due to bending can be more effectively prevented.

Figure 13:
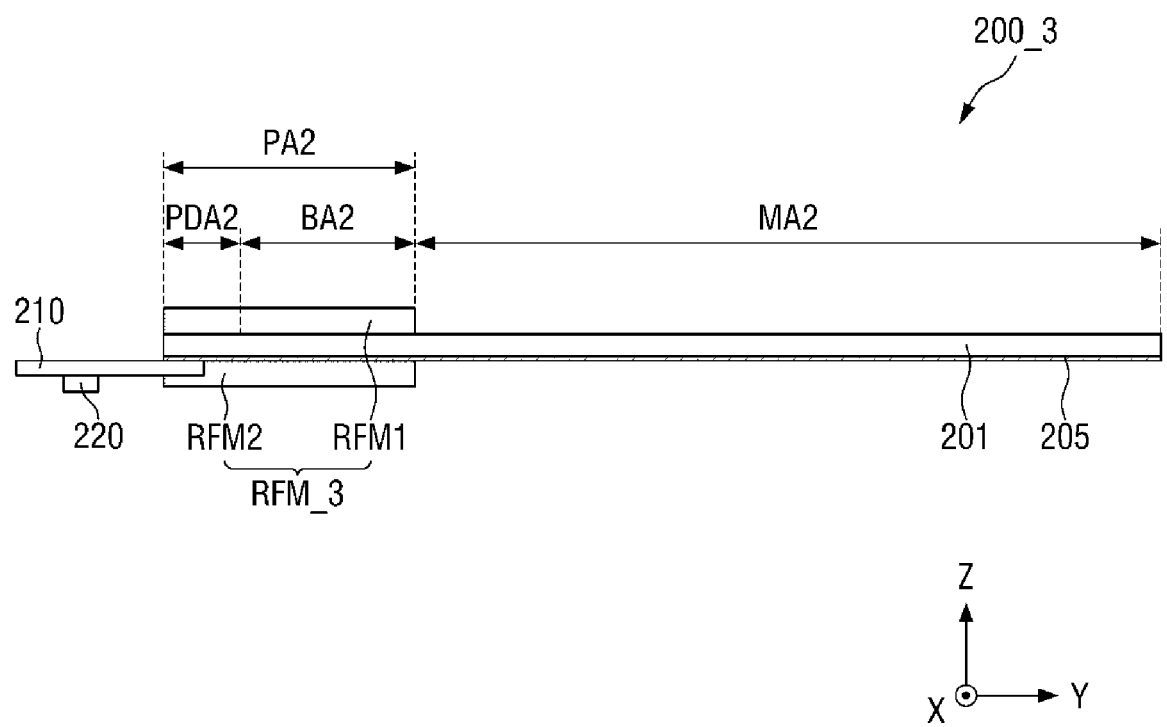
FIG. 13 is a cross-sectional view of a touch sensing device according to some exemplary embodiments.
Figure 14:
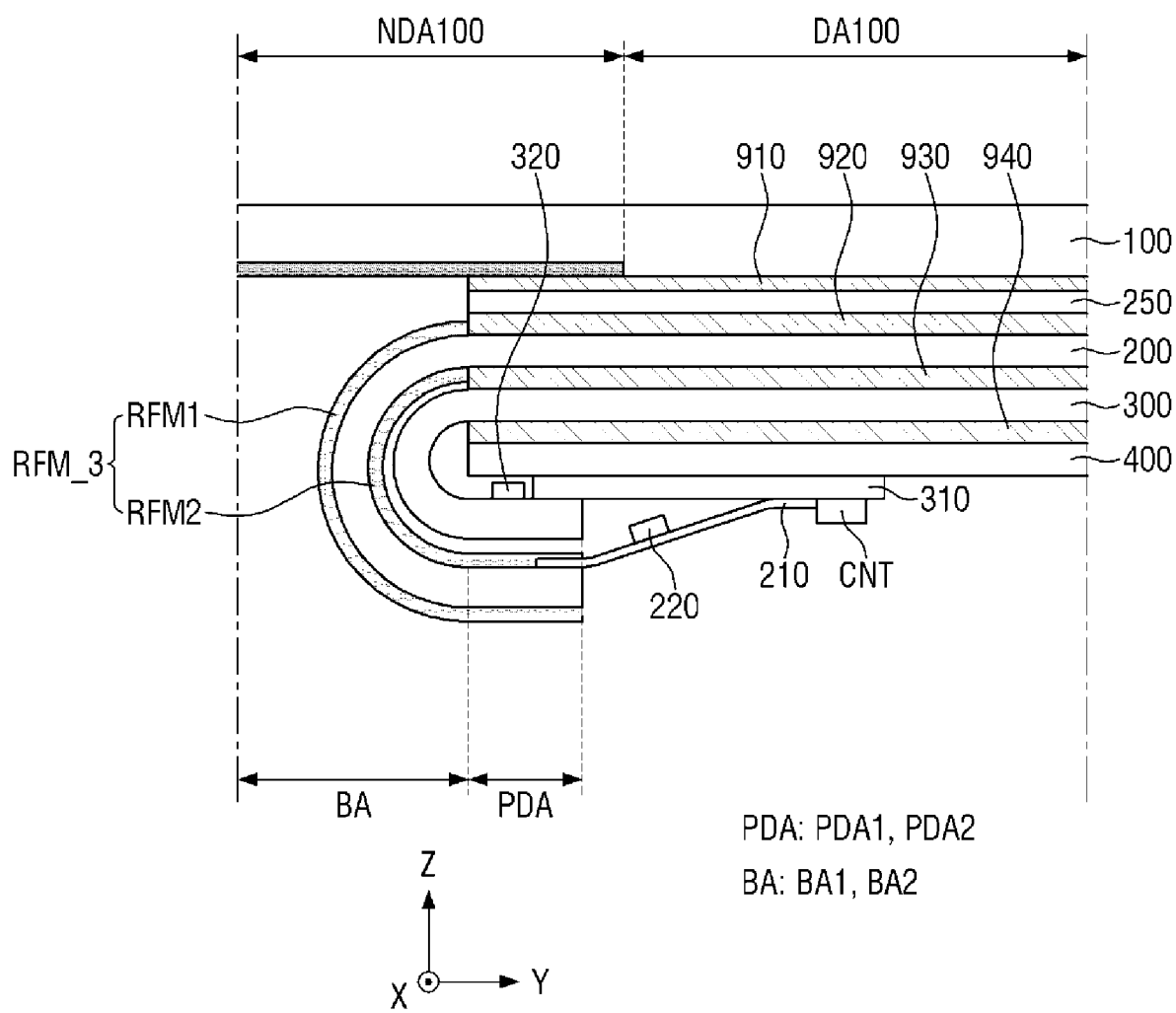
FIG. 14 is a cross-sectional view illustrating a structure of the touch sensing device of FIG. 13 in a bent state according to some exemplary embodiments.

FIG. 13 is a cross-sectional view of a touch sensing device according to some exemplary embodiments. FIG. 14 is a cross-sectional view illustrating a structure of the touch sensing device of FIG. 13 in a bent state according to some exemplary embodiments. The exemplary embodiments described in association with FIGS. 13 and 14 are different from the exemplary embodiments described in association with FIGS. 11 and 12 in that reinforcing members RFM_3 are disposed on upper and lower surfaces of a second protruding area PA2, respectively. A redundant description of elements and features identical to those of the exemplary embodiments described in association with FIGS. 11 and 12 will be omitted, and differences will be mainly described below.

Referring to FIGS. 13 and 14, the touch sensing device 200_3 may include a second main area MA2 and the second protruding area PA2 protruding from the second main area MA2 in the direction opposite to the second direction (e.g., Y-axis direction). The second main area MA2 and the second protruding area PA2 of the touch sensing device 200_3 may include a base layer 201 and a touch electrode layer 205 disposed under the base layer 201.

A touch circuit board 210 may be mounted in a second pad area PDA2 of the touch sensing device 200_3. For example, the touch circuit board 210 may be mounted on a lower surface of the touch electrode layer 205 in the second pad area PDA2.

The reinforcing members RFM_3 may be disposed in the second protruding area PA2 of the touch sensing device 200_3. For example, a first reinforcing member RFM1 may be disposed on an upper surface of the base layer 201 in the second protruding area PA2 of the touch sensing device 200_3, and a second reinforcing member RFM2 may be disposed on the lower surface of the touch electrode layer 205 in the second protruding area PA2 of the touch sensing device 200_3.

Each of the first reinforcing member RFM1 and the second reinforcing member RFM2 may be disposed in a second bending area BA2 and the second pad area PDA2. In addition, the second reinforcing member RFM2 may cover the second bending area BA2 and a part of the touch circuit board 210 disposed in the second pad area PDA2. When the second reinforcing member RFM2 covers a part of the touch circuit board 210, the connection between the touch circuit board 210 and the second pad area PDA2 of the touch sensing device 200_3 can be reinforced.

Although the first reinforcing member RFM1 and the second reinforcing member RFM2 have the same thickness in the third direction (e.g., Z-axis direction) in FIG. 13, this is merely an example. In some exemplary embodiments, the thickness of the second reinforcing member RFM2 in the third direction (e.g., Z-axis direction) may be greater than the thickness of the first reinforcing member RFM1 in the third direction (e.g., Z-axis direction) so that the touch electrode layer 205 can be positioned adjacent to a neutral plane. In addition, in some exemplary embodiments, a modulus of the second reinforcing member RFM2 may be relatively greater than a modulus of the first reinforcing member RFM1 so that the touch electrode layer 205 can be positioned adjacent to the neutral plane.

The reinforcing members RFM_3 may be bent when the second bending area BA2 of the touch sensing device 200_3 is bent and may cause the second bending area BA2 of the touch sensing device 200_3 to be positioned adjacent to the neutral plane in order to prevent damage due to bending. In addition, the reinforcing members RFM_3 may cover attached portions of the touch circuit board 210 and pads, thereby stably connecting the touch circuit board 210 and the pads. Further, when the touch electrode layer 205 is subjected to compressive stress by being bent inside the base layer 201, the stress of the touch electrode layer 205 is reduced as compared with when the touch electrode layer 205 is subjected to tensile stress by being bent outside the base layer 201. Therefore, damage to the touch electrode layer 205 due to bending can be more effectively prevented.

Figure 15:
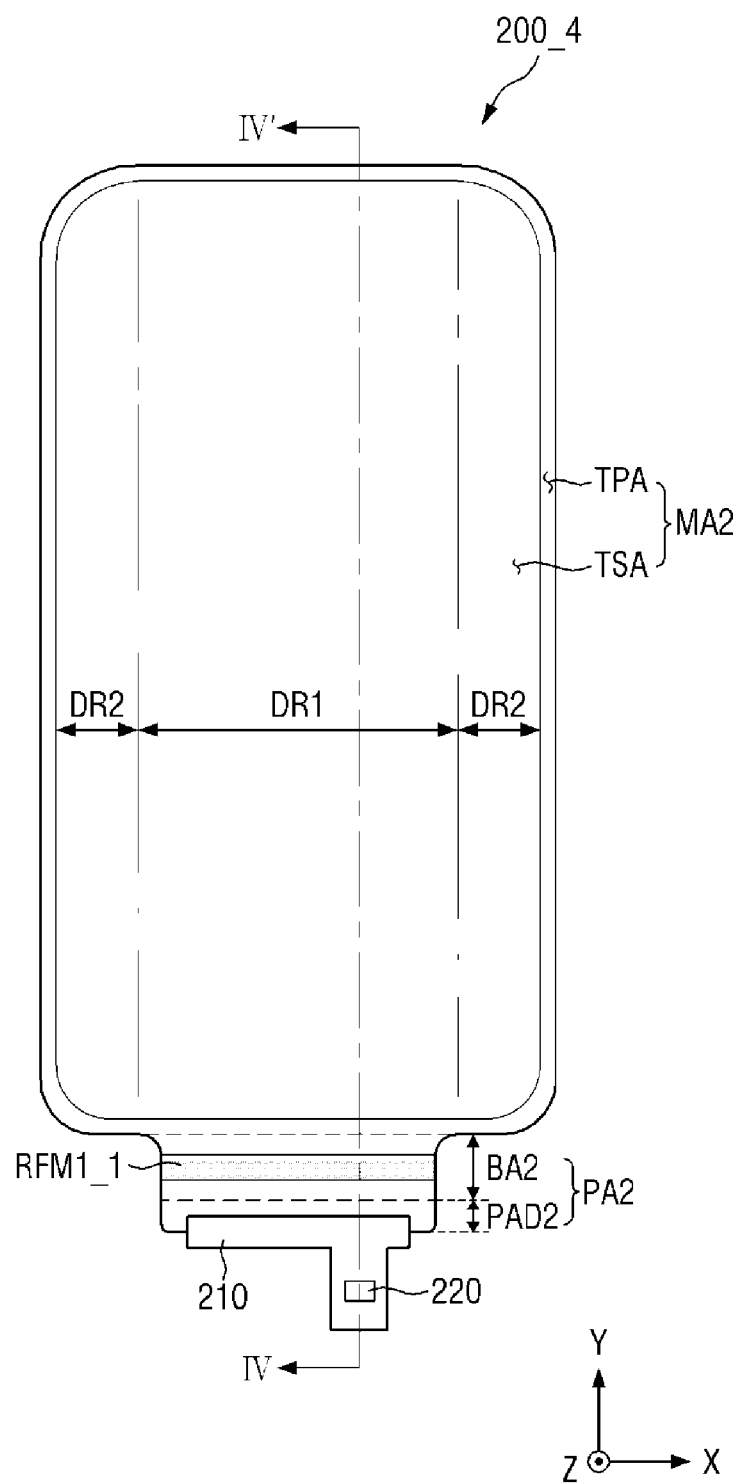
FIG. 15 is a plan view of a touch sensing device according to some exemplary embodiments.
Figure 16:
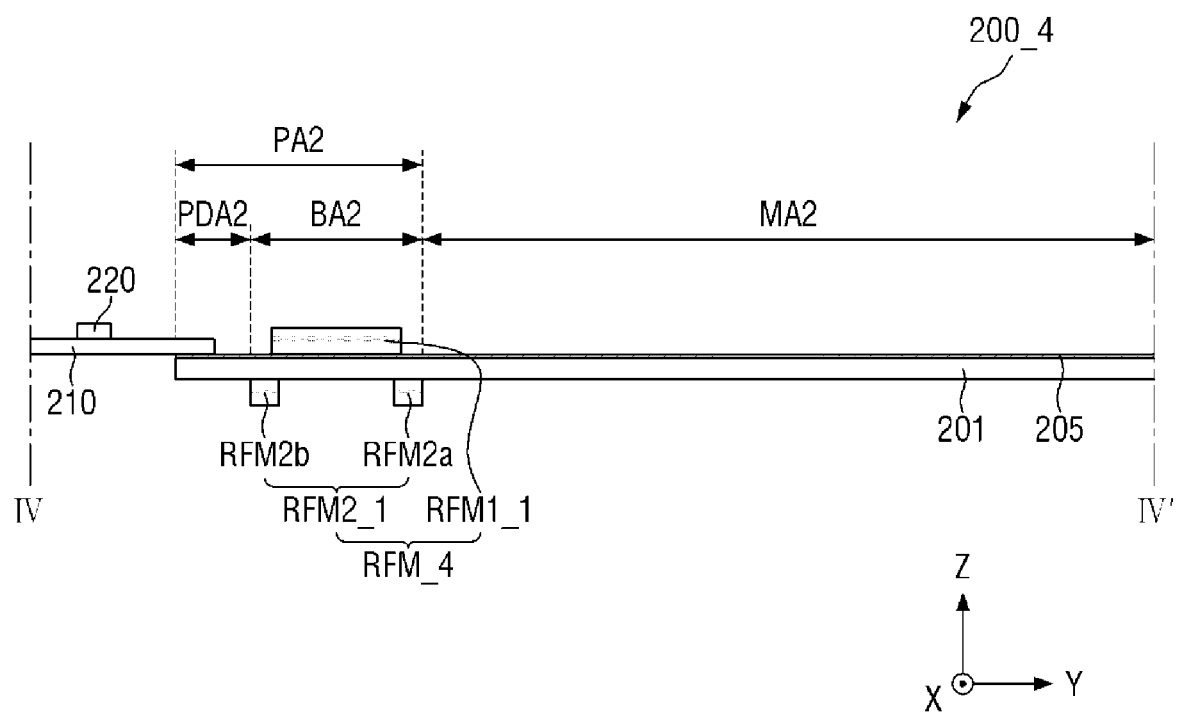
FIG. 16 is a cross-sectional view of the touch sensing device of FIG. 15 taken along sectional line IV-IV' according to some exemplary embodiments.
Figure 17:
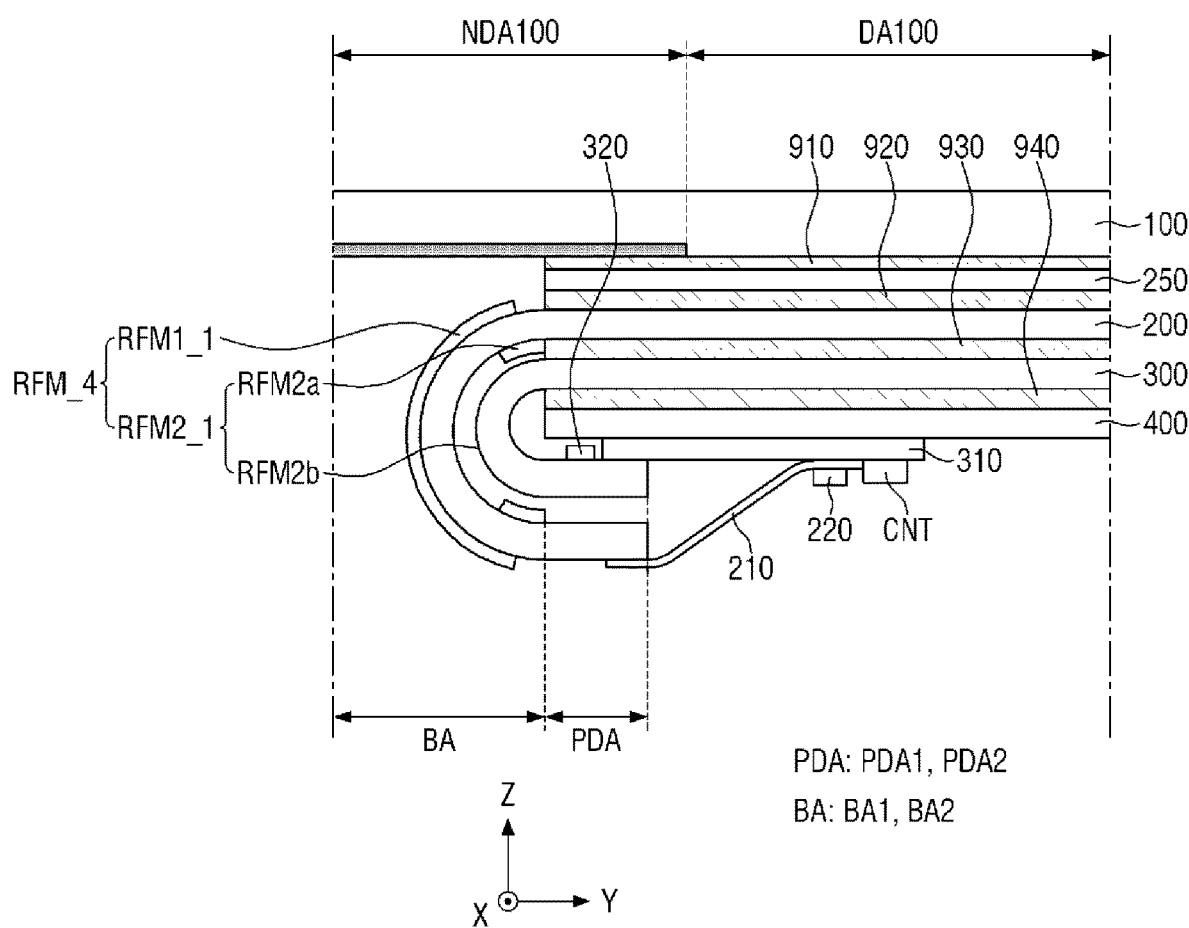
FIG. 17 is a cross-sectional view illustrating a structure of the touch sensing device of FIG. 16 in a bent state according to some exemplary embodiments.

FIG. 15 is a plan view of a touch sensing device according to some exemplary embodiments. FIG. 16 is a cross-sectional view of the touch sensing device of FIG. 15 taken along sectional line IV-IV' according to some exemplary embodiments. FIG. 17 is a cross-sectional view illustrating a structure of the touch sensing device of FIG. 16 in a bent state according to some exemplary embodiments. The exemplary embodiments described in association with FIGS. 15 through 17 are different from the exemplary embodiments described in association with FIGS. 4, 7, and 8 in the shape and arrangement of reinforcing members RFM_4. A redundant description of elements and features identical to those of the exemplary embodiments described in association with FIGS. 4, 7, and 8 will be primarily omitted, and differences will be mainly described below.

Referring to FIGS. 15 through 17, the reinforcing members RFM_4 may be disposed in a second protruding area PA2 of the touch sensing device 200_4. For example, a first reinforcing member RFM1_1 may be disposed on an upper surface of the second protruding area PA2 of the touch sensing device 200_4. A second reinforcing member RFM2_1 may be disposed on a lower surface of the second protruding area PA2 of the touch sensing device 200_4.

The first reinforcing member RFM1_1 may be disposed on a touch electrode layer 205 in a second bending area BA2. For example, a length of the first reinforcing member RFM1_1 in the second direction (e.g., Y-axis direction) may be smaller than a length of the second bending area BA2 in the second direction (e.g., Y-axis direction). Accordingly, even if the first reinforcing member RFM1_1 is disposed, a part of the second bending area BA2 may be exposed.

The second reinforcing member RFM2_1 may be disposed under a base layer 201 in the second bending area BA2. The second reinforcing member RFM2_1 may include a $(2a)^{th}$ reinforcing member RFM2a and a $(2b)^{th}$ reinforcing member RFM2b. The $(2a)^{th}$ reinforcing member RFM2a and the $(2b)^{th}$ reinforcing member RFM2b may be spaced apart from each other in the second direction (e.g., Y-axis direction). For example, the $(2a)^{th}$ reinforcing member RFM2a may be located adjacent to a second main area MA2, and the $(2b)^{th}$ reinforcing member RFM2b may be located adjacent to a second pad area PDA2.

A part of each of the $(2a)^{th}$ reinforcing member RFM2a and the $(2b)^{th}$ reinforcing member RFM2b may overlap the first reinforcing member RFM1_1 in the third direction (e.g., Z-axis direction). In addition, the other part of each of the $(2a)^{th}$ reinforcing member RFM2a and the $(2b)^{th}$ reinforcing member RFM2b may not overlap the first reinforcing member RFM1_1 in the third direction (e.g., Z-axis direction).

When a part of each of the $(2a)^{th}$ reinforcing member RFM2a and the $(2b)^{th}$ reinforcing member RFM2b overlaps the first reinforcing member RFM1_1 in the third direction (e.g., Z-axis direction) while the other part of each of the $(2a)^{th}$ reinforcing member RFM2a and the $(2b)^{th}$ reinforcing member RFM2b does not overlap the first reinforcing member RFM1_1 in the third direction (e.g., Z-axis direction), an end and the other end of the first reinforcing member RFM1_1 do not overlap an end of the $(2a)^{th}$ reinforcing member RFM2a and an end of the $(2b)^{th}$ reinforcing member RFM2b, respectively. Accordingly, the concentration of steps formed according to the arrangement of the first reinforcing member RFM1_1 and the second reinforcing member RFM2_1 can be minimized (or at least reduced), thereby effectively preventing creation of cracks in stepped areas during bending.

Figure 18:
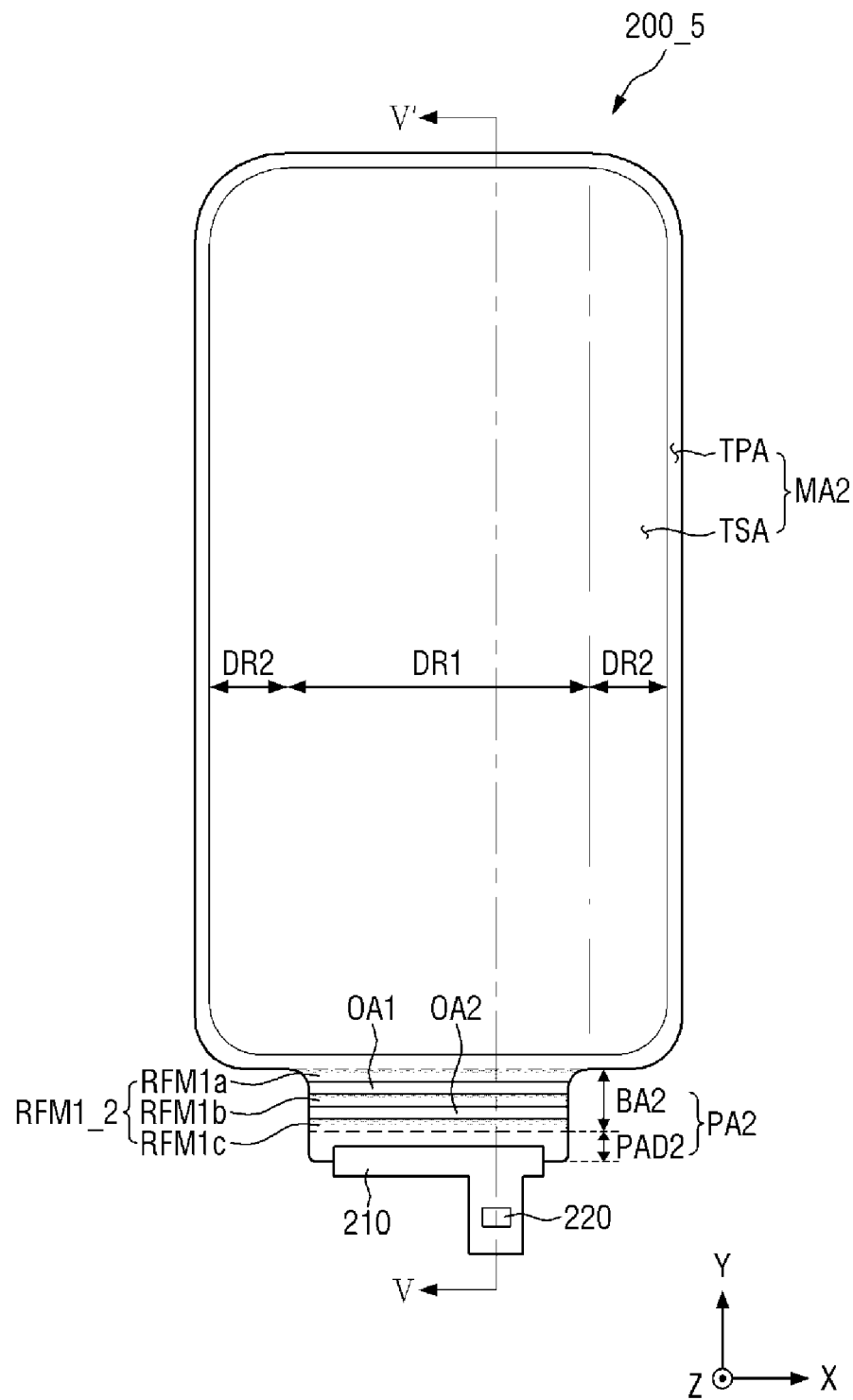
FIG. 18 is a plan view of a touch sensing device according to some exemplary embodiments.
Figure 19:
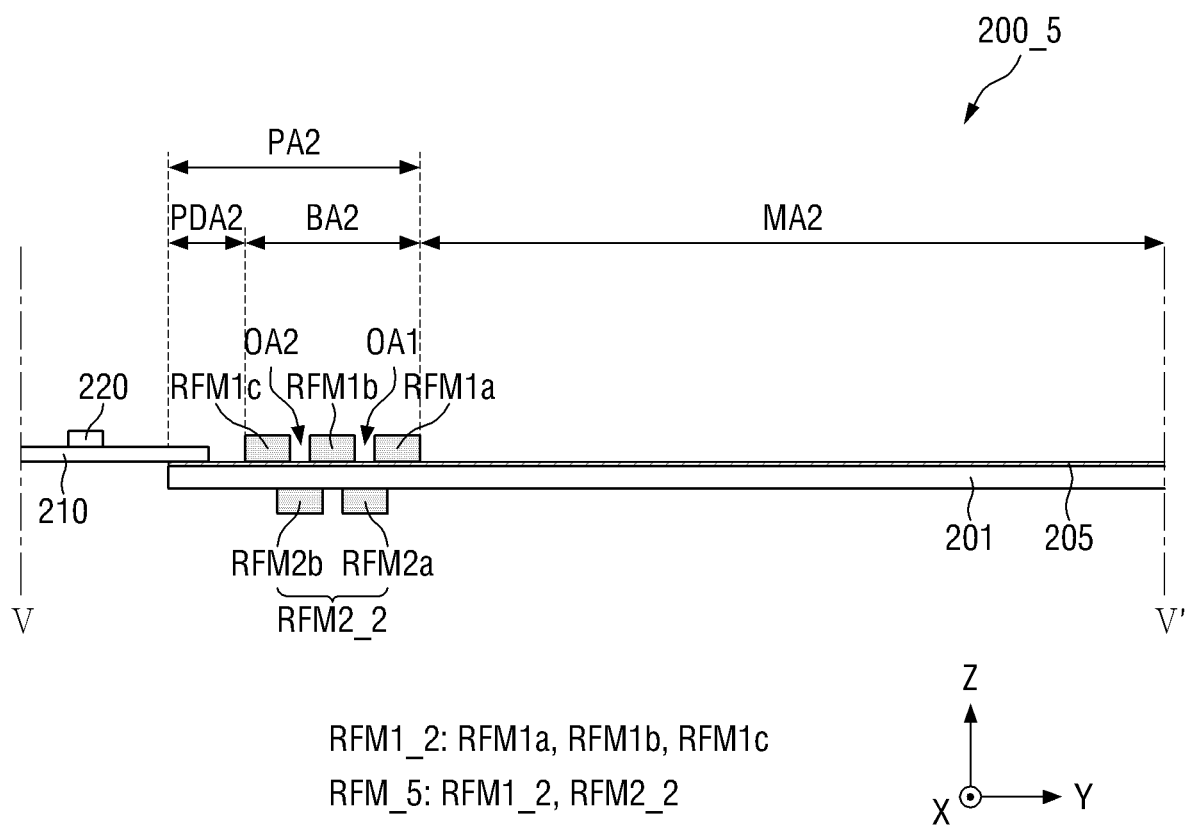
FIG. 19 is a cross-sectional view of the touch sensing device of FIG. 18 taken along sectional line V-V' according to some exemplary embodiments.
Figure 20:
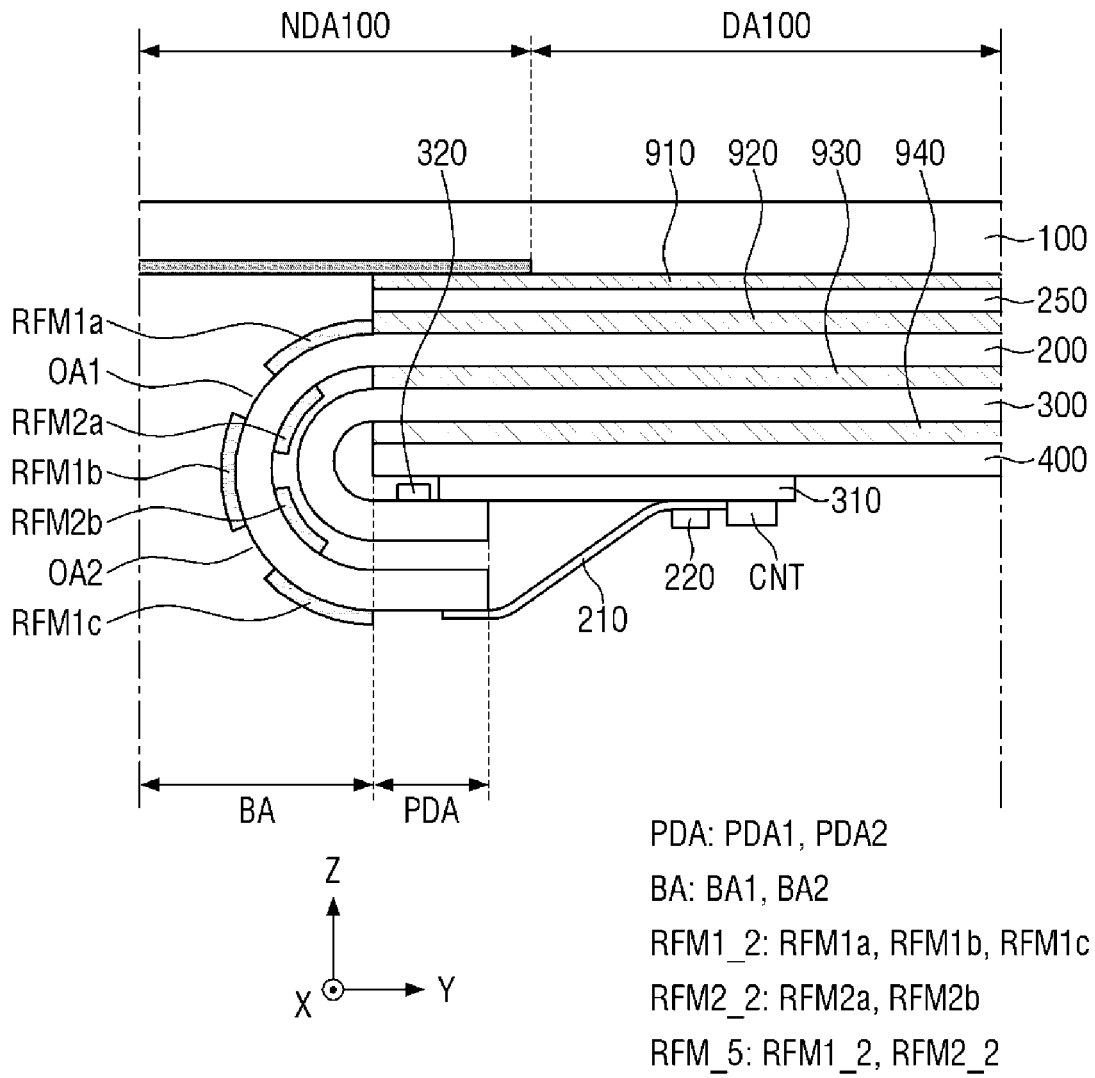
FIG. 20 is a cross-sectional view illustrating a structure of the touch sensing device of FIG. 19 in a bent state according to some exemplary embodiments.

FIG. 18 is a plan view of a touch sensing device according to some exemplary embodiments. FIG. 19 is a cross-sectional view of the touch sensing device of FIG. 18 taken along sectional line V-V' according to some exemplary embodiments. FIG. 20 is a cross-sectional view illustrating a structure of the touch sensing device of FIG. 19 in a bent state according to some exemplary embodiments. The exemplary embodiments described in association with FIGS. 18 through 20 are different from the exemplary embodiments described in association with FIGS. 15 through 17 in the shape and arrangement of reinforcing members RFM_5. A redundant description of elements and features identical to those of the exemplary embodiments described in association with FIGS. 15 through 17 will be primarily omitted, and differences will be mainly described below.

Referring to FIGS. 18 through 20, the reinforcing members RFM_5 may be disposed in a second protruding area PA2 of the touch sensing device 200_5. For example, a first reinforcing member RFM1_2 may be disposed on an upper surface of the second protruding area PA2 of the touch sensing device 200_5. A second reinforcing member RFM2_2 may be disposed on a lower surface of the second protruding area PA2 of the touch sensing device 200_5.

The first reinforcing member RFM1_2 may be disposed on a touch electrode layer 205 in a second bending area BA2. The first reinforcing member RFM1_2 may include a $(1a)^{th}$ reinforcing member RFM1a, a $(1b)^{th}$ reinforcing member RFM1b and a $(1c)^{th}$ reinforcing member RFM1c Each of the $(1a)^{th}$ reinforcing member RFM1a, the $(1b)^{th}$ reinforcing member RFM1b, and the $(1c)^{th}$ reinforcing member RFM1c may be shaped like a bar extending in the first direction (e.g., X-axis direction). The $(1a)^{th}$ reinforcing member RFM1a, the $(1b)^{th}$ reinforcing member RFM1b, and the $(1c)^{th}$ reinforcing member RFM1c may be spaced apart from each other in the second direction (e.g., Y-axis direction). For example, the $(1a)^{th}$ reinforcing member RFM1a may be located adjacent to a second main area MA2, the $(1c)^{th}$ reinforcing member RFM1c may be located adjacent to a second pad area PDA2, and the $(1b)^{th}$ reinforcing member RFM1b may be located between the $(1a)^{th}$ reinforcing member RFM1a and the $(1c)^{th}$ reinforcing member RFM1c.

A first spacing area OA1 may be located between the $(1a)^{th}$ reinforcing member RFM1a and the $(1b)^{th}$ reinforcing member RFM1b, and a second spacing area OA2 may be located between the $(1b)^{th}$ reinforcing member RFM1b and the $(1c)^{th}$ reinforcing member RFM1c.

The second reinforcing member RFM2_2 may be disposed under a base layer 201 in the second bending area BA2. The second reinforcing member RFM2_2 may include a $(2a)^{th}$ reinforcing member RFM2a and a $(2b)^{th}$ reinforcing member RFM2b. The $(2a)^{th}$ reinforcing member RFM2a and the $(2b)^{th}$ reinforcing member RFM2b may be spaced apart from each other in the second direction (e.g., Y-axis direction). For example, the $(2a)^{th}$ reinforcing member RFM2a may be located adjacent to the second main area MA2, and the $(2b)^{th}$ reinforcing member RFM2b may be located adjacent to the second pad area PDA2.

A part of each of the $(2a)^{th}$ reinforcing member RFM2a and the $(2b)^{th}$ reinforcing member RFM2b may overlap a portion of the first reinforcing member RFM1_2. In addition, the other part of each of the $(2a)^{th}$ reinforcing member RFM2a and the $(2b)^{th}$ reinforcing member RFM2b may overlap at least one of the first and second spacing areas OA1 and OA2 in the third direction (e.g., Z-axis direction).

For instance, the $(2a)^{th}$ reinforcing member RFM2a may overlap a part of the $(1a)^{th}$ reinforcing member RFM1a, a part of the $(1b)^{th}$ reinforcing member RFM1b, and the first spacing area OA1 in the third direction (e.g., Z-axis direction). The $(2b)^{th}$ reinforcing member RFM2b may overlap a part of the $(1b)^{th}$ reinforcing member RFM1b, a part of the $(1c)^{th}$ reinforcing member RFM1c, and the second spacing area OA2 in the third direction (e.g., Z-axis direction).

When the second reinforcing member RFM2_2 overlaps a part of the first reinforcing member RFM2_1 and the first and second spacing areas OA1 and OA2 in the third direction (e.g., Z-axis direction), the concentration of steps formed according to the arrangement of the first reinforcing member RFM1_2 and the second reinforcing member RFM2_2 can be minimized (or at least reduced), thereby effectively preventing creation of cracks in stepped areas during bending.

Figure 21:
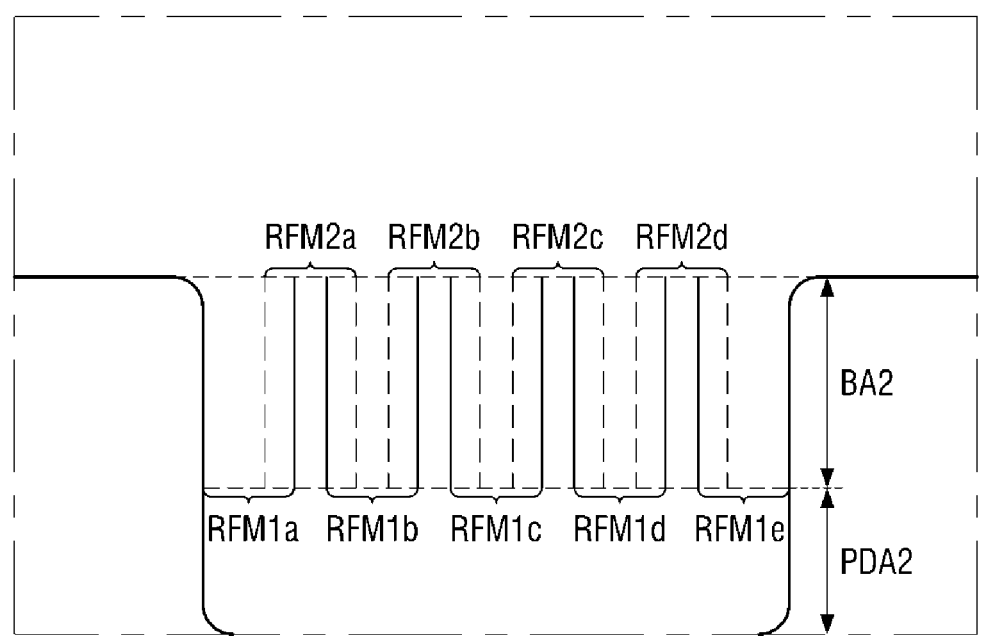
FIGS. 21, 22, and 23 illustrate reinforcing members according to some exemplary embodiments.
Figure 21:
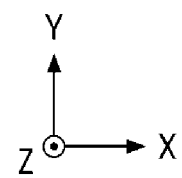
Figure 22:
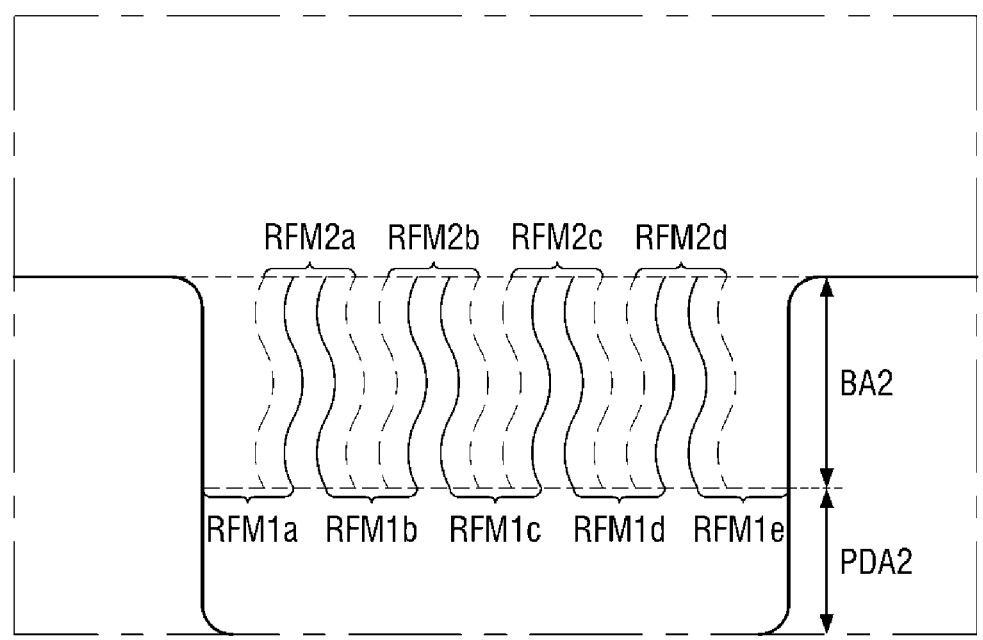
Figure 22:
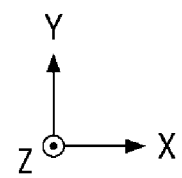
Figure 23:
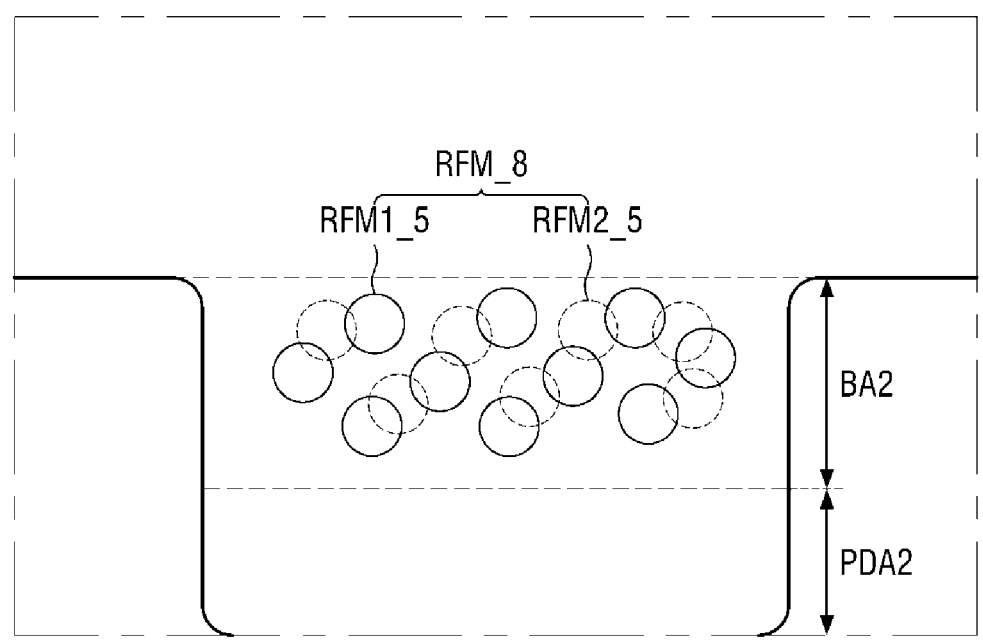

FIGS. 21, 22, and 23 illustrate reinforcing members according to some exemplary embodiments. In FIGS. 21 through 23, a second bending area BA2 and a second pad area PDA2 of a touch sensing device are schematically illustrated for ease of description. Solid lines indicate first reinforcing members RFM1_3, RFM1_4, and RFM1_5 disposed on an upper surface of the second bending area BA2, and dotted lines indicate second reinforcing members RFM2_3, RFM2_4, and RFM2_5 disposed on a lower surface of the second bending area BA2.

Referring to FIG. 21, the first reinforcing member RFM1_3 may include a $(1a)^{th}$ reinforcing member RFM1a, a $(1b)^{th}$ reinforcing member RFM1b, a $(1c)^{th}$ reinforcing member RFM1c, a $(1d)^{th}$ reinforcing member RFM1d, and a $(1e)^{th}$ reinforcing member RFM1e.

Each of the $(1a)^{th}$ reinforcing member RFM1a, the $(1b)^{th}$ reinforcing member RFM1b, the $(1c)^{th}$ reinforcing member RFM1c, the $(1d)^{th}$ reinforcing member RFM1d, and the $(1e)^{th}$ reinforcing member RFM1e may be shaped like a quadrilateral bar extending in the second direction (e.g., Y-axis direction). However, exemplary embodiments are not limited to this case. As illustrated in FIG. 22, each of the $(1a)^{th}$ reinforcing member RFM1a, the $(1b)^{th}$ reinforcing member RFM1b, the $(1c)^{th}$ reinforcing member RFM1c, the $(1d)^{th}$ reinforcing member RFM1d and the $(1e)^{th}$ reinforcing member RFM1e included in the first reinforcing member RFM1_4 may be shaped like a curved bar extending in the second direction (e.g., Y-axis direction).

The $(1a)^{th}$ reinforcing member RFM1a, the $(1b)^{th}$ reinforcing member RFM1b, the $(1c)^{th}$ reinforcing member RFM1c, the $(1d)^{th}$ reinforcing member RFM1d, and the $(1e)^{th}$ reinforcing member RFM1e may be spaced apart from each other in the first direction (e.g., X-axis direction).

The second reinforcing member RFM2_3 may include a $(2a)^{th}$ reinforcing member RFM2a, a $(2b)^{th}$ reinforcing member RFM2b, a $(2c)^{th}$ reinforcing member RFM2c, and a $(2d)^{th}$ reinforcing member RFM2d. Each of the $(2a)^{th}$ reinforcing member RFM2a, the $(2b)^{th}$ reinforcing member RFM2b, the $(2c)^{th}$ reinforcing member RFM2c, and the $(2d)^{th}$ reinforcing member RFM2d may be shaped like a quadrilateral bar extending in the second direction (e.g., Y-axis direction). However, exemplary embodiments are not limited to this case. As illustrated in FIG. 22, each of the $(2a)^{th}$ reinforcing member RFM2a, the $(2b)^{th}$ reinforcing member RFM2b, the $(2c)^{th}$ reinforcing member RFM2c, and the $(2d)^{th}$ reinforcing member RFM2d included in the second reinforcing member RFM2_4 may be shaped like a curved bar extending in the second direction (e.g., Y-axis direction).

The $(2a)^{th}$ reinforcing member RFM2a, the $(2b)^{th}$ reinforcing member RFM2b, the $(2c)^{th}$ reinforcing member RFM2c, and the $(2d)^{th}$ reinforcing member RFM2d may be spaced apart from each other in the first direction (e.g., X-axis direction). For example, the $(2a)^{th}$ reinforcing member RFM2a may overlap a part of the $(1a)^{th}$ reinforcing member RFM1a, a part of the $(1b)^{th}$ reinforcing member RFM1b, and a spacing area between the $(1a)^{th}$ reinforcing member RFM1a and the $(1b)^{th}$ reinforcing member RFM1b in the third direction (e.g., Z-axis direction). The $(2b)^{th}$ reinforcing member RFM2b may overlap a part of the $(1b)^{th}$ reinforcing member RFM1b, a part of the $(1c)^{th}$ reinforcing member RFM1c, and a spacing area between the $(1b)^{th}$ reinforcing member RFM1b and the $(1c)^{th}$ reinforcing member RFM1c in the third direction (e.g., Z-axis direction). The $(2c)^{th}$ reinforcing member RFM2c may overlap a part of the $(1c)^{th}$ reinforcing member RFM1c, a part of the $(1d)^{th}$ reinforcing member RFM1d, and a spacing area between the $(1c)^{th}$ reinforcing member RFM1c and the $(1d)^{th}$ reinforcing member RFM1d in the third direction (e.g., Z-axis direction). The $(2d)^{th}$ reinforcing member RFM2d may overlap a part of the $(1d)^{th}$ reinforcing member RFM1d, a part of the $(1e)^{th}$ reinforcing member RFM1e, and a spacing area between the (1d)$^{th}$ reinforcing member RFM1*d* and the (1e)$^{th}$ reinforcing member RFM1*e* in the third direction (e.g., Z-axis direction).

Referring to FIG. 23, reinforcing members RFM_8 may include the first reinforcing member RFM1_5 and the second reinforcing member RFM2_5.

Each of the first and second reinforcing members RFM1_5 and RFM2_5 may be circular. For example, the first reinforcing members RFM1_5 may be circular and may be disposed in plural numbers on the upper surface of the second bending area BA2, and the second reinforcing member RFM2_5 may be circular and may be disposed in plural numbers on the lower surface of the second bending area BA2. It is contemplated, however, that each of the first and second reinforcing members RFM1_5 and RFM2_5 may have various shapes, such as an elliptical shape, a polygonal shape, etc.

The first reinforcing members RFM1_5 and the second reinforcing members RFM2_5 may partially overlap each other in the third direction (e.g., Z-axis direction). For example, the first reinforcing members RFM1_5 and the second reinforcing members RFM2_5 may include areas overlapping each other in the third direction (e.g., Z-axis direction) and areas not overlapping each other.

Although the first reinforcing members RFM1_5 and the second reinforcing members RFM2_5 are irregularly arranged in FIG. 23, exemplary embodiments are not limited to this case, and the first reinforcing members RFM1_5 and the second reinforcing members RFM2_5 may also be regularly arranged.

According to various exemplary embodiments, a touch sensing device may include a bending area in which a reinforcing member is disposed. Therefore, the touch sensing device can be stably bent.

According to various exemplary embodiments, a display device may include a touch sensing device that is stably bent, and a touch driving circuit may be connected to the touch sensing device under a display panel. Therefore, a light shielding area of the display device can be effectively reduced.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A touch sensing device comprising:
a base layer comprising a main area and a protruding area protruding from the main area in a first direction;
a touch electrode layer disposed on a surface of the base layer;
a first reinforcing member disposed on a surface of the protruding area;
a second reinforcing member disposed on another surface of the protruding area, the another surface opposing the surface; and
a touch circuit board electrically connected to the touch electrode layer,
wherein the protruding area comprises:
a bending area bent downward; and
a pad area extending from the bending area in the first direction and overlapping the base layer in a second direction intersecting the first direction in a bent state of the bending area,
wherein the touch circuit board is attached to the pad area,
wherein, in a plan view of an unbent state of the protruding area, one end of the second reinforcing member directly contacts the main area and the second reinforcing member does not overlap the main area in the second direction,
wherein the second reinforcing member directly contacts the another surface of the protruding area of the base layer,
wherein the first reinforcing member and the second reinforcing member each respectively entirely cover the bending area,
wherein the first reinforcing member also covers a portion of the pad area, and
wherein the second reinforcing member does not cover any portion of the pad area.

2. The touch sensing device of claim 1, wherein the first reinforcing member is disposed in the bending area and the pad area, and covers a part of the touch circuit board.

3. The touch sensing device of claim 2, wherein, in the protruding area, the touch electrode layer is disposed between the first reinforcing member and the base layer.

4. The touch sensing device of claim 3, wherein the second reinforcing member is disposed in the bending area.

5. The touch sensing device of claim 4, wherein a modulus of the first reinforcing member is greater than a modulus of the second reinforcing member.

6. The touch sensing device of claim 1, wherein the first reinforcing member and the second reinforcing member are alternately arranged in the first direction.

7. The touch sensing device of claim 6, wherein the first reinforcing member and the second reinforcing member partially overlap each other in a thickness direction.

8. The touch sensing device of claim 7, wherein each of the first reinforcing member and the second reinforcing member is shaped like a curved bar.

9. The touch sensing device of claim 1, wherein the first reinforcing member comprises a plurality of circular bodies disposed on the surface of the protruding area.

10. The touch sensing device of claim 9, wherein:
the second reinforcing member comprises a plurality of circular bodies; and
the second reinforcing member partially overlaps the first reinforcing member in the thickness direction.

11. A touch sensing device comprising:
a base layer comprising a main area and a protruding area protruding from the main area in a first direction;
a touch electrode layer disposed on a surface of the base layer;
a first reinforcing member disposed on a surface of the protruding area;
a second reinforcing member disposed on another surface of the protruding area, the another surface opposing the surface; and
a touch circuit board electrically connected to the touch electrode layer,
wherein the protruding area comprises:
a bending area bent downward; and
a pad area extending from the bending area in the first direction and overlapping the base layer in a second direction intersecting the first direction in a bent state of the bending area,
wherein the touch circuit board is attached to the pad area,
wherein, in a plan view of an unbent state of the protruding area, the second reinforcing member is spaced apart from the touch electrode layer, wherein the second reinforcing member directly contacts the another surface of the protruding area of the base layer, and wherein:
the second reinforcing member comprises a (2a)-th reinforcing member and a (2b)-th reinforcing member that are spaced a part from each other on the another surface of the protruding area;
the (2a)-th reinforcing member does not overlap the main area in the second direction;
the bending area comprises a first area adjacent to the main area, a second area adjacent to the pad area, and a third area disposed between the first area and the second area;
the first reinforcing member is disposed in the third area, the (2a)-th reinforcing member is disposed adjacent to a boundary between the first area and the third area, and the (2b)-th reinforcing member is disposed adjacent to a boundary between the second area and the third area,
the first reinforcing member comprises a (1a)-th reinforcing member and a (1b)-th reinforcing member spaced a part from the (1a)-th reinforcing member on the surface of the protruding area that is opposite to the another surface of the protruding area,
the second reinforcing member does not cover any portion of the pad area, and
the (2a)-th reinforcing member overlaps a part of the (1a)-th reinforcing member, a part of the (1b)-th reinforcing member, and a first spacing area located between the (1a)-th reinforcing member and the (1b)-th reinforcing member, and
in a bent state, the (2a)-th reinforcing member remains spaced apart from the (2b)-th reinforcing member.

12. A display device comprising:
a display panel comprising a first main area and a first protruding area protruding from the first main area in a first direction; and
a touch sensing device disposed on the display panel, the touch sensing device comprising a second main area overlapping the first main area and a second protruding area overlapping the first protruding area,
wherein the first protruding area comprises:
a first bending area bent downward from the display panel; and
a first pad area extending from the first bending area in the first direction and overlapping the display panel in a second direction intersecting the first direction in a bent state of the first bending area,
wherein the second protruding area comprises:
a second bending area bent outside the first protruding area; and
a second pad area extending from the second bending area in the first direction and overlapping the display panel in the second direction in a bent state of the second bending area, and wherein:
a first reinforcing member is disposed on a surface of the second protruding area;
a second reinforcing member is disposed on another surface of the second protruding area, the another surface opposing the surface;
in a plan view of an unbent state of the second protruding area, one end of the second reinforcing member directly contacts the second main area and the second reinforcing member does not overlap the second main area in the second direction;
the second reinforcing member directly contacts the another surface of the second protruding area;
the first bending area of the first protruding area and the second bending area of the second protruding area are spaced apart from each other;
the first reinforcing member and the second reinforcing member each respectively entirely cover the second bending area;
the first reinforcing member covers a portion of the second pad area; and
the second reinforcing member does not cover any portion of the second pad area.

13. The display device of claim 12, wherein the first reinforcing member is disposed in the second bending area and the second pad area.

14. The display device of claim 13, further comprising:
a touch circuit board electrically connected to the touch sensing device,
wherein an end of the touch circuit board is disposed between the first reinforcing member and the second pad area.

15. The display device of claim 14, further comprising:
a display circuit board electrically connected to the display panel, disposed between the display panel and the touch circuit board, and comprising a connector,
wherein another end of the touch circuit board is connected to the connector.

16. The display device of claim 14, wherein the second reinforcing member is disposed in the second bending area.

17. The display device of claim 16, wherein a modulus of the first reinforcing member is greater than a modulus of the second reinforcing member.

18. The display device of claim 12, wherein the first reinforcing member and the second reinforcing member are alternately arranged in the first direction.

19. The display device of claim 18, wherein the first reinforcing member and the second reinforcing member partially overlap each other in a thickness direction.

* * * * *